United States Patent [19]
Aziz et al.

[11] Patent Number: 5,949,645
[45] Date of Patent: Sep. 7, 1999

[54] ELECTRONIC UNIT

[75] Inventors: Farid H. Aziz, Kanata; Hope E. Ring; Balwantrai V. Mistry, both of Nepean; J. Michele Low, Ottawa; Mark R. Harris, Woodlawn, all of Canada

[73] Assignee: Northern Telecom Limited, Montreal, Canada

[21] Appl. No.: 09/064,552

[22] Filed: Apr. 23, 1998

Related U.S. Application Data

[60] Provisional application No. 60/048,326, Jun. 2, 1997.

[51] Int. Cl.⁶ .................................................. H05K 7/20
[52] U.S. Cl. ........................ 361/695; 361/694; 361/725; 361/727; 361/741; 361/756; 165/104.33; 174/16.1; 454/184; 312/223.2
[58] Field of Search ...................... 361/727, 730, 361/735, 683, 687, 784, 785, 788, 796, 803, 694, 695; 439/64, 65; 312/223.2

[56] References Cited

U.S. PATENT DOCUMENTS

| | | | |
|---|---|---|---|
| 4,899,254 | 2/1990 | Ferchau et al. | 361/785 |
| 5,277,615 | 1/1994 | Hastings et al. | 361/685 |
| 5,460,441 | 10/1995 | Hastings et al. | 312/223.2 |
| 5,557,506 | 9/1996 | Wood et al. | 361/796 |
| 5,680,294 | 10/1997 | Stora et al. | 361/695 |
| 5,680,295 | 10/1997 | Le et al. | 361/395 |

*Primary Examiner*—Leo P. Picard
*Assistant Examiner*—Boris L. Chervinsky
*Attorney, Agent, or Firm*—R. J. Austin; Angela C. de Wilton

[57] ABSTRACT

An electronic unit with a mother board carrier beneath a service carrier in a housing. The carriers are independently movable between retracted use positions and forward access positions for maintenance. Service components are hence of no hindrance when removing printed circuit boards from the mother board carrier. The mother board is horizontal with the primary surface facing upwards. This latter feature together with the orientation of other printed circuit boards and of the service components minimizes the frontal area of the unit and provides pathways for front-to-rear cooling air flow. A connector arrangement connects the two carriers together only when both carriers are in their retracted use positions. Flexible lengths of cable extending between the carriers together with attendant stowage and hindrance problems are thus avoided. A retaining bar structure is included which acts at multiple positions against daughter boards to hold them securely against vibration during transporting and also in use.

27 Claims, 15 Drawing Sheets

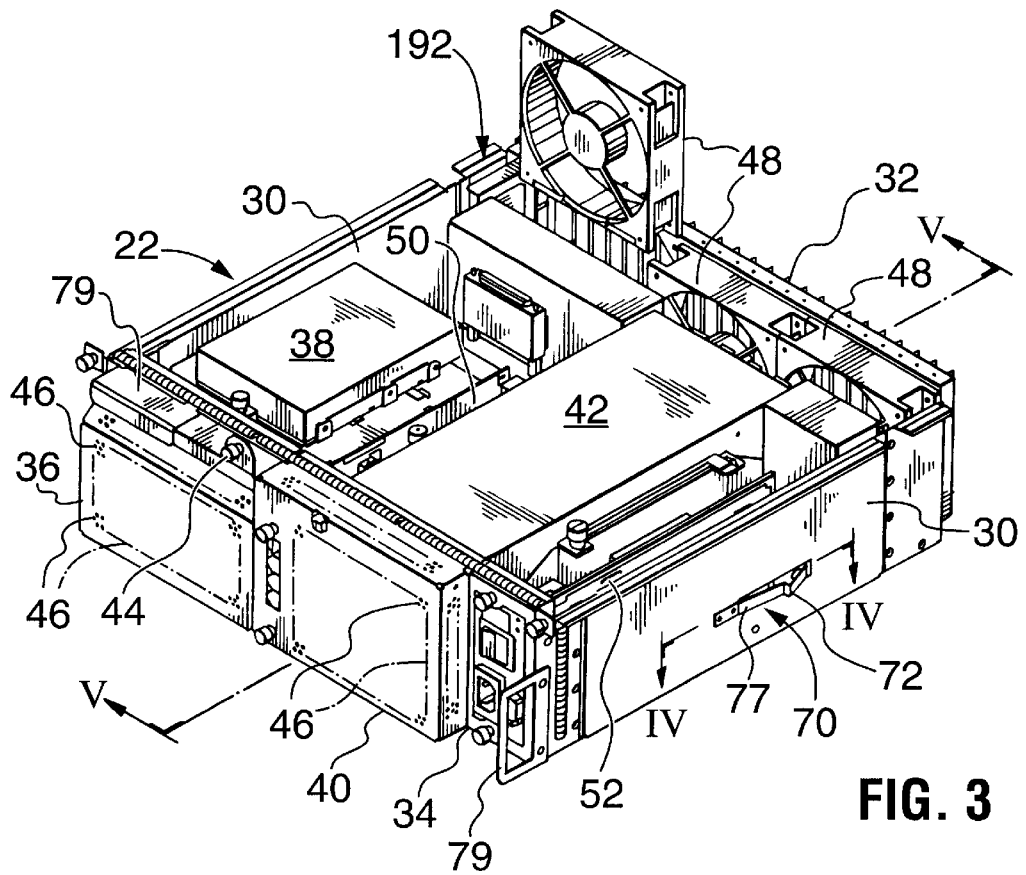
FIG. 3
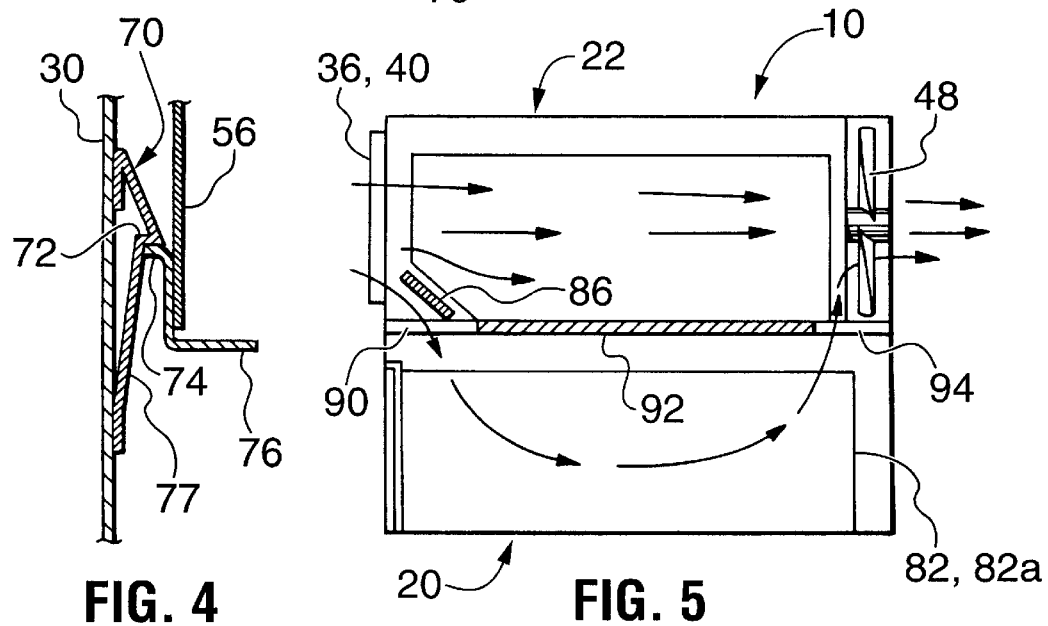
FIG. 4
FIG. 5

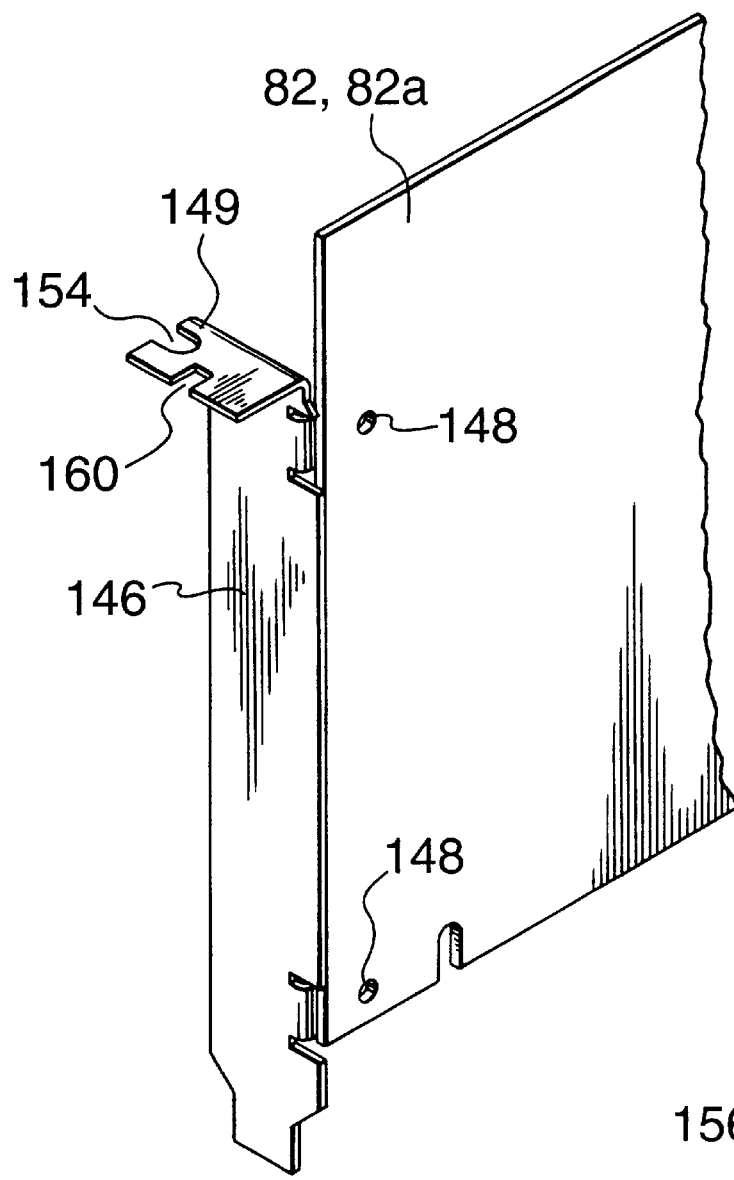
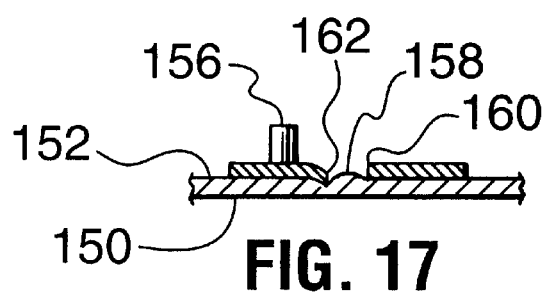
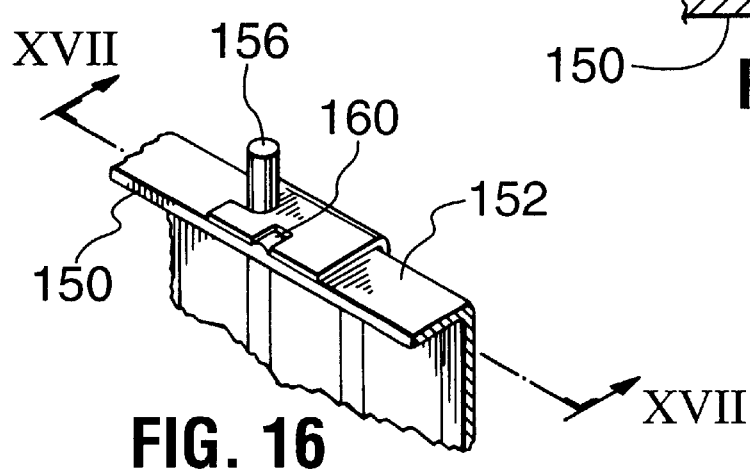

ELECTRONIC UNIT

This application claims benefit of provisional application 60/048,326, filed Jun. 2, 1997.

This invention relates to electronic units.

Certain types of electronic units as used in the electronics industry, e.g. the telecommunications industry, incorporate mother boards with daughter boards mounted thereon and support components such as power supplies and cooling fans. Such units normally present inordinately large frontal areas thereby causing them to occupy large rack or wall space. Such large frontal areas are at least partly caused by the geometrical positioning of components of the units and also by the relative positions of the components. The large frontal area aspect of such units is particularly important when multiples of the units are mounted together in stacked or in side-by-side arrangements as this factor seriously curtails the application density of the units.

A further problem with known kinds of electronic units is the accessibility to the components within the units for repair or maintenance purposes when such units are mounted in their use positions. For maintenance or repair upon any particular unit, the unit is required to be opened as required by its design for access to the mother board, daughter boards, and secondary components of the unit such as the drive elements, power supply elements, fans etc. Some designs of conventional electronic units require removal of multiple housing sides for accessibility to the components within and this operation is lengthy and tedious in procedure. In other structures, the design requirements are such that the units have printed circuit boards accessible only from a side or from beneath the units and difficulties are experienced in enabling selected daughter boards to be released and removed without interfering with the location of other boards or with other components.

Yet further problems are concerned with the locations of cables and/or conductors coming into and disposed within electronic units and also with the positive location of boards in their required locations. Cables or conductors may be awkwardly placed in electronic units, thereby acting as a hindrance to access to components within the units or rendering the cables or conductors themselves inaccessible. With regard to board location, sufficient measures may not be taken to ensure daughter board securement and there is sometimes a need for more positive ground connection of boards to housings of the electronic units.

The present invention provides an electronic unit which seeks to avoid or minimize the above disadvantages in use.

According to one aspect of the present invention there is provided an electronic unit comprising a support structure having a front and a rear, and supporting a mother board carrier and at least one service carrier to house service components to be electrically connected to printed circuit boards to be received in the mother board carrier, the mother board carrier having a mounting position for mounting a mother board with the mother board extending in a front to rear direction of the support structure and with a primary side of the mother board facing upwardly, the mother board carrier also having a plurality of daughter board receiving stations extending upwards from the mother board mounting position. The mother board carrier is movable, in relation to the service carrier, between a retracted use position and a forward access position, and the receiving stations are accessible for vertical insertion and removal of the daughter boards with the mother board carrier in the access position.

With the electronic unit according to the above aspect of the invention, the structure is such that with the provision of the mother board carrier, only certain components of the unit need be moved forwardly to the access position for the purpose of repair or replacement of the mother or daughter boards. Thus with the service carrier remaining within the support structure when the mother board carrier is in the access position, then the design of the unit may be such as to improve access to the printed circuit boards and the components not normally requiring repair or replacement remain in their use positions. It follows therefore that with the structure according to the above aspect of the invention and with the mother board carrier not being required to carry certain, i.e. service components, access to the printed circuit boards is largely unhampered with the mother board carrier in the access position. Hence, with the structure of the invention, the daughter boards, and possibly also the mother board, may be removed upwardly from the mother board carrier so that repair or replacement may easily be accomplished. It follows that when the unit is secured to a wall, or on a supporting surface, or in a rack arrangement in a stack or side-by-side with other electronic units, that the mother board carrier, in being moved to the access position brings the daughter boards forwardly away from the support structure and also away from the total structure provided by a multiplicity of such units.

Preferably, both the mother board and service carriers are movable, independently of one another, between retracted use positions and forward access positions.

With the above structure of the invention, with the mother board extending with a primary side facing upwardly, then the unit does not have a frontal area the minimum size of which is controlled by a vertically extending mother board structure. Instead, in a unit of the invention, it is the daughter boards which extend upwardly from the mother board and which have some effect on the height of the electronic unit and thus on the frontal area of the unit. As daughter boards may be made exceptionally low in heights compared to mother boards, then this leads to a minimization of the frontal area of the unit thereby maximizing the density of the units in a stack or side-by-side relationship and within a specific unit area of mounting space.

In yet a further preferred arrangement of the above aspect of the invention, one of the carriers is mounted vertically above the other carrier and preferably, the service carrier is the upper of the two carriers. In this arrangement, the service carrier preferably includes at least one fan located advantageously at a rear of the unit. An air intake provided at the front of the unit enables cooling air to be drawn between the daughter boards and through the unit to remove heat from within the unit and through the fan. In this particular case, it is advantageous to orientate the mother board within the mount so that each of the daughter boards extends in a front to rear direction so that the cooling air passes between adjacent daughter boards as it is being drawn through the unit. This preferred structure also has the advantage that heat generated by the power supply or any subsidiary equipment of the unit is positioned above the printed circuit boards and hence the likelihood of heat being transferred to the printed circuit boards is minimized.

Alternatively, however, in another arrangement, the mother board carrier is disposed above the service carrier. It is also possible, of course, to provide the service carrier to one side of the mother board carrier thereby providing a different frontal shape to the unit in that the unit is thus wider but less deep vertically than previously discussed arrangements.

With the preferred arrangement in which the daughter boards extend in a front to rear direction as specified above, it is convenient for access to be provided at the front of the mother board carrier for connecting electrical conductors into the daughter boards. With this arrangement, for passing cooling air between the daughter boards, it is convenient to provide air inlets above the daughter boards and to provide a baffle to direct the cooling air downwardly between the daughter boards. The air inlets and the baffle may be provided as part of the service carrier with this disposed above the mother board carrier.

According to another aspect of the present invention an electronic unit is provided in which a support structure carries both mother board and service carriers with both carriers movable independently of one another between retracted use positions within the support structure and access positions forwardly of the support structure, and in which printed circuit boards within the mother board carrier are connected to service components in the service carrier only when both carriers are in retracted use positions. For this purpose, both mother board and service carriers have electrical connector means located at rear portions of the carriers. These electrical connector means are connected to electrical connectors which are carried by the support structure and are themselves electrically interconnected together. Hence, each of the carriers is only connected into the connectors carried by the support structure when the carriers are in their retracted use positions. Any movement of either carrier towards its access position will effectively electrically disconnect printed circuit boards or service components in that carrier from the connectors carried by the support structure. It follows that signal and power are connected between the service and mother board carriers by a blind mate technique.

The latter inventive concept avoids the need for cable, individual conductors, or a conductor harness to extend from one carrier to the other. It also avoids the attendant complication of the untidiness presented by providing sufficient lengths of cable to accommodate movement of each carrier independently to its forward access position while the other carrier remains in its retracted use position. Such required lengths would require stowage of the lengths with both of the carriers in their retracted use positions and this could produce storage problems which could have the effect of increasing the size of the carriers beyond that which would normally be required. This inventive concept recognizes the fact that electrical connection between service components in the service carrier and printed circuit boards in the mother board carrier are required only when both carriers are in use, that is when in their retracted use positions. It follows therefore that with the use of this inventive aspect, when either carrier is in its access position, then electrical interconnection between the two carriers is discontinued.

According to yet a further aspect of the present invention, an electronic unit is provided which comprises a mother board carrier defining a mother board mounting position, a plurality of side-by-side daughter board receiving stations for locating a plurality of daughter boards in these receiving stations while being connected to the mother board, each daughter board having a face plate and each face plate and the mother board carrier having cooperable registration means to detachably dispose the respective daughter board in a fixed position in its receiving station, and a retaining bar provided to retain the daughter boards in their fixed positions.

With the above aspect of the invention, the registration means positively locates the daughter boards in exactly their required orientational positions for connection to the mother board. In a preferred arrangement, the face plate of each daughter board has a cutting edge which when the retaining bar is moved to locate the daughter boards in their fixed positions, positively engages a surface of the mother board carrier to provide good electrical ground contact for its respective printed circuit board.

One embodiment of the invention will now be described, by way of example, with reference to the accompanying drawings, in which:

FIG. 2a is a cross-sectional view along line IIa—IIa in FIG. 2;

FIG. 3 is an isometric view of an upper carrier of the unit;

FIG. 4 is a cross-sectional view taken along line IV—IV in FIG. 3, and to a larger scale and showing a detail of the mounting of the upper carrier relative to the lower carrier;

FIG. 5 is a diagrammatic cross-sectional view taken along line V—V in FIG. 3;

FIG. 15 is a front isometric view of part of a daughter board to be mounted in the lower carrier;

FIG. 16 is an isometric view in the same direction as FIG. 15 and showing detail of the daughter board mounted in its desired position in the lower carrier;

FIG. 17 is a cross-sectional view taken along line XVII—XVII in FIG. 16;

Figure 1:
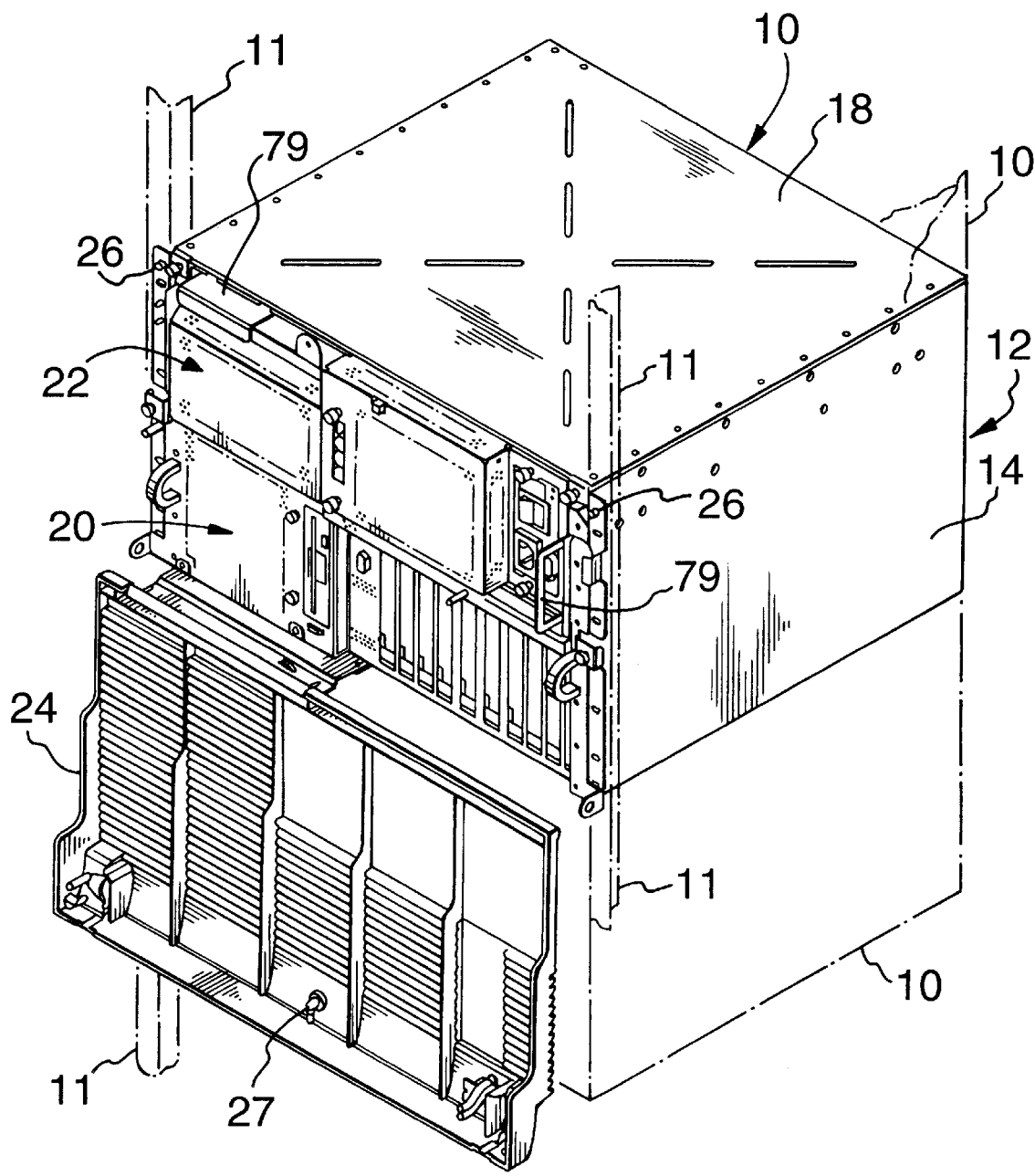
FIG. 1 is an isometric view of an electronic unit mounted in a stack together with other units.

As shown by FIG. 1, an electronic computing unit 10 for use in the telecommunications industry is one of a plurality of identical units 10 held in a frame in a vertical stack arrangement, the frame being shown simply by front vertical frame members 11 in the drawings.

Figure 8:
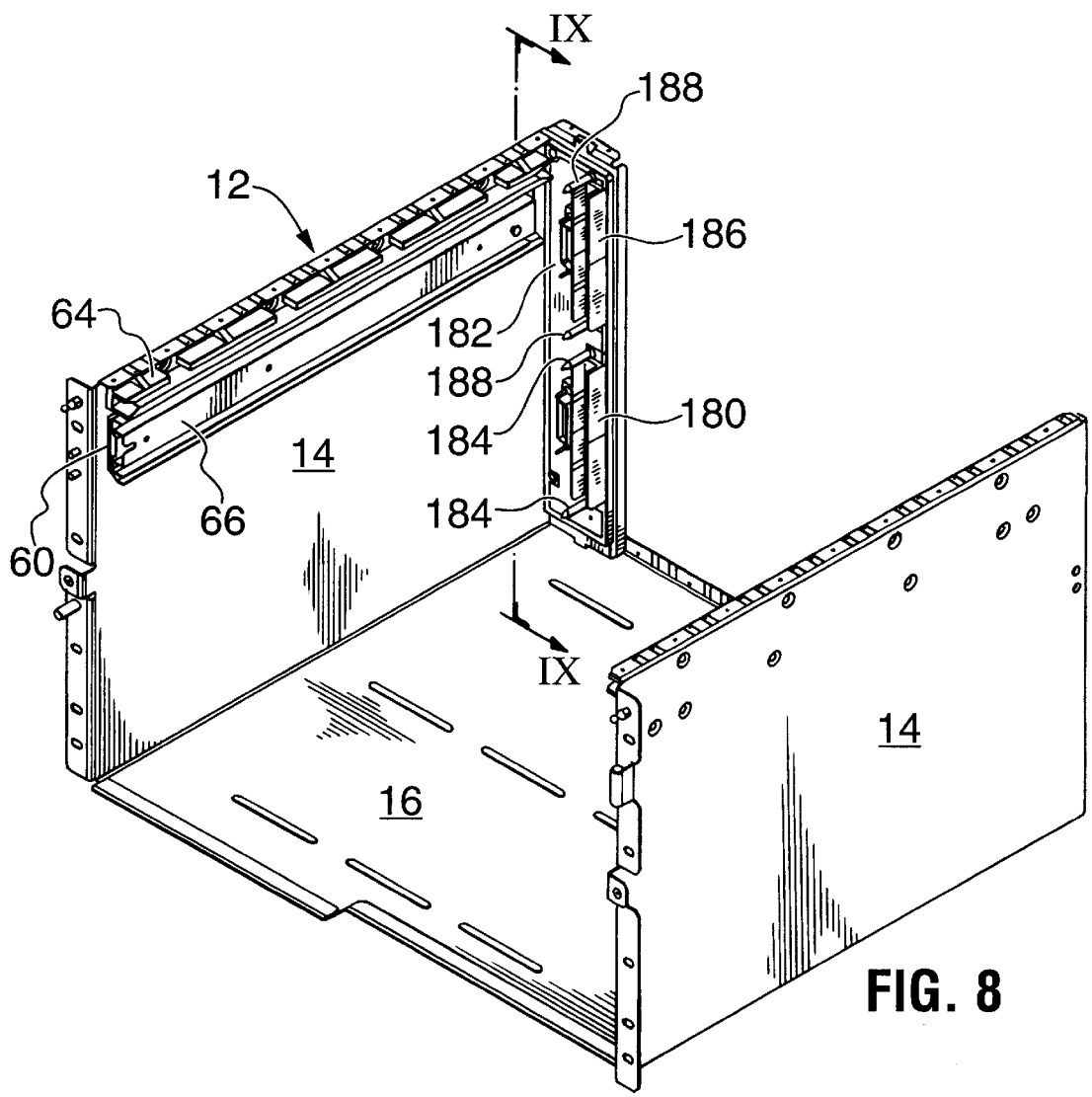
FIG. 8 is an isometric view of the support structure and a blind mate back plane to provide electrical continuity between upper and lower carriers.

The unit 10 comprises support structure in the form of a housing 12 having sides 14, a base 16 (see FIG. 8) and a top 18. Within the housing 12 are movably disposed two carriers, a lower or mother board carrier 20 and an upper or service carrier 22. The unit is normally closed by a louvered front plastic cover 24 which is pivoted along a horizontal lower edge so as to be located, in use, in front of the two carriers 20 and 22. The cover 24 is held in position by the reception of two ball studs 26 which are disposed at the top end of a flange of the housing 12 and a central locking latch 27 of the cover (FIG. 1). In all views showing the cover 24, this is shown in a lowered position for access to the carriers.

Figure 2:
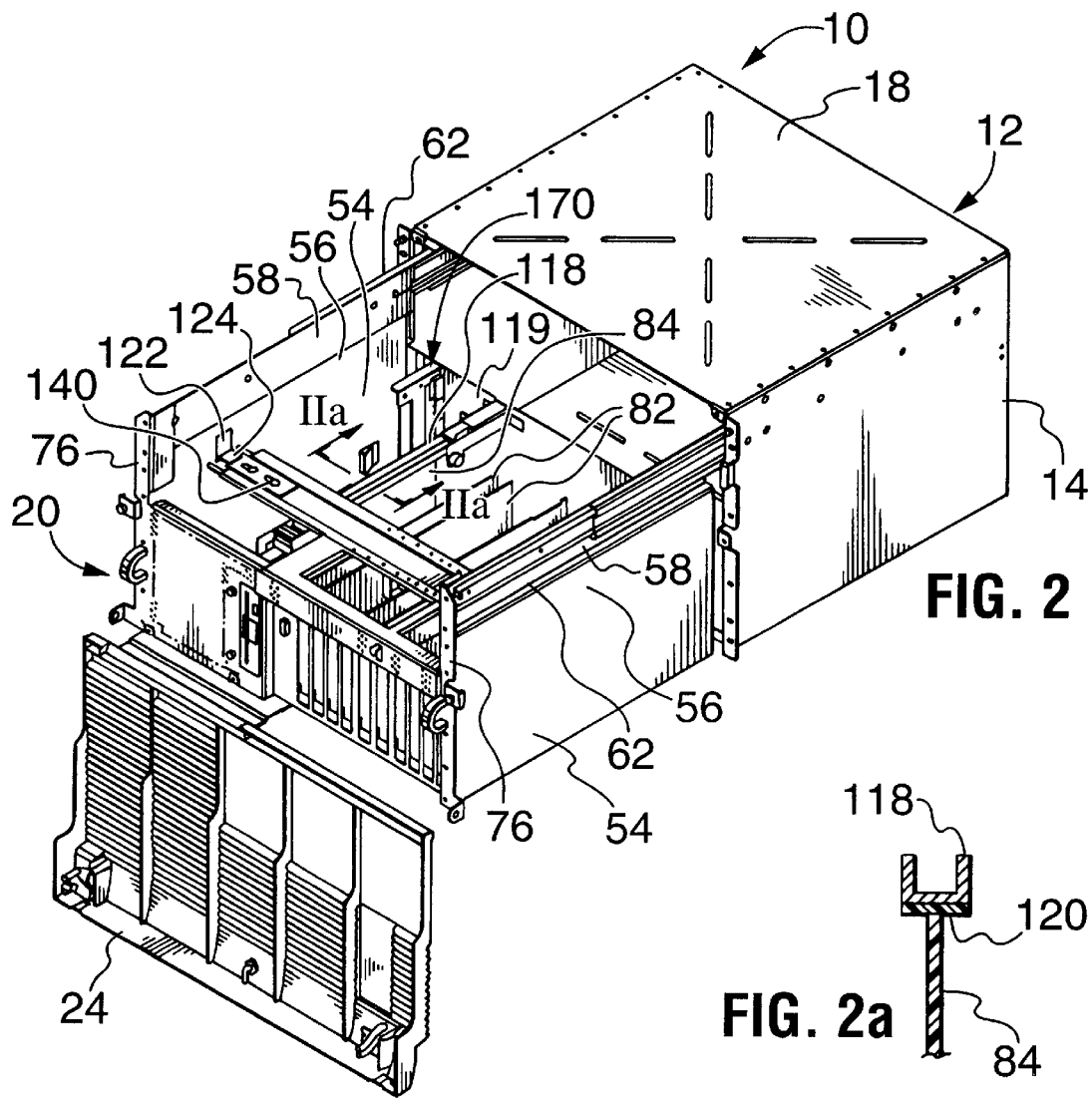
FIG. 2 is a view similar to FIG. 1 with a lower carrier of the unit moved into a forward access position and with an upper carrier omitted for clarity.
Figure 6:
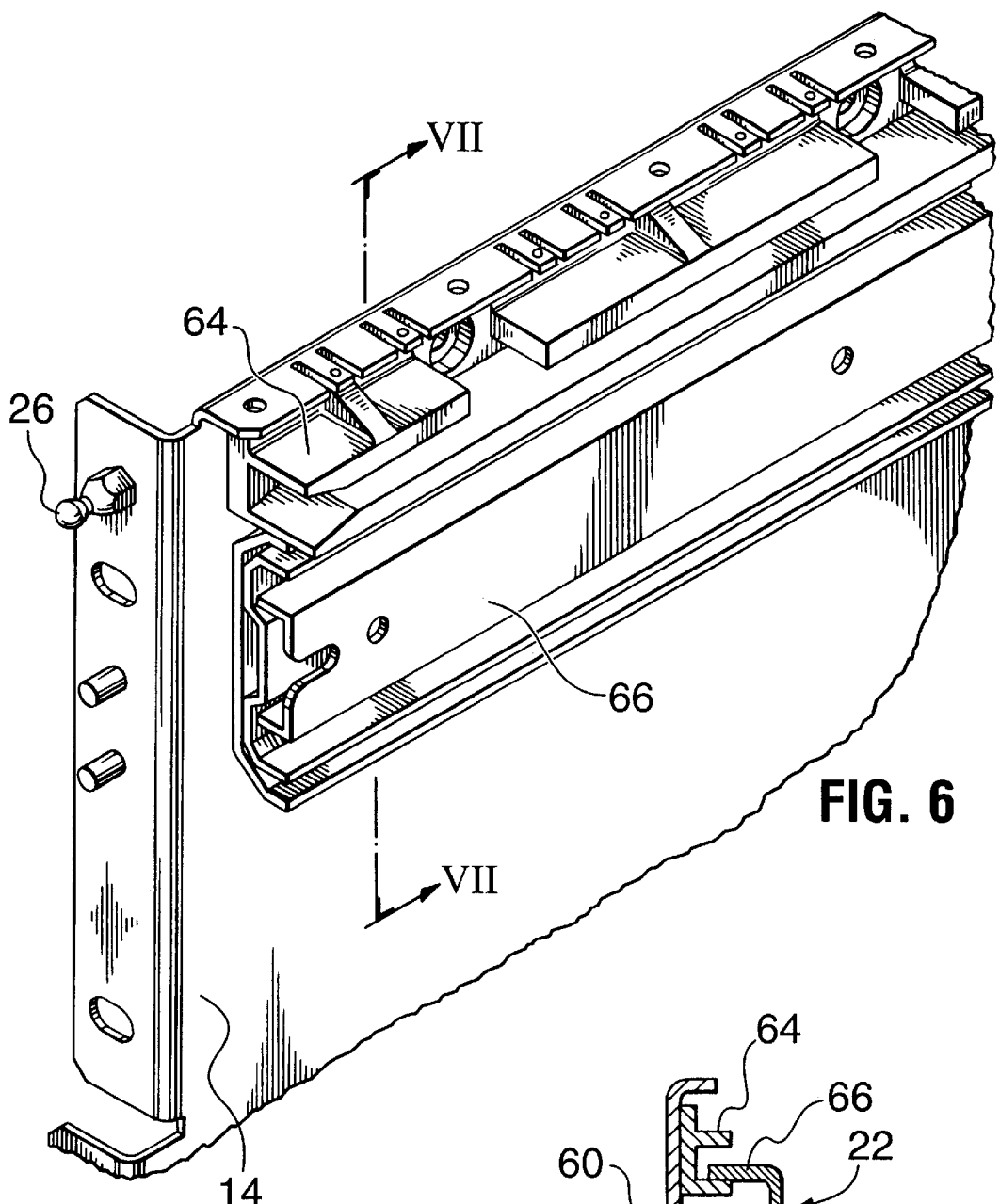
FIG. 6 is an isometric view to a larger scale than FIG. 1 and showing part of a mounting means for mounting the carriers within the support structure.
Figure 10:
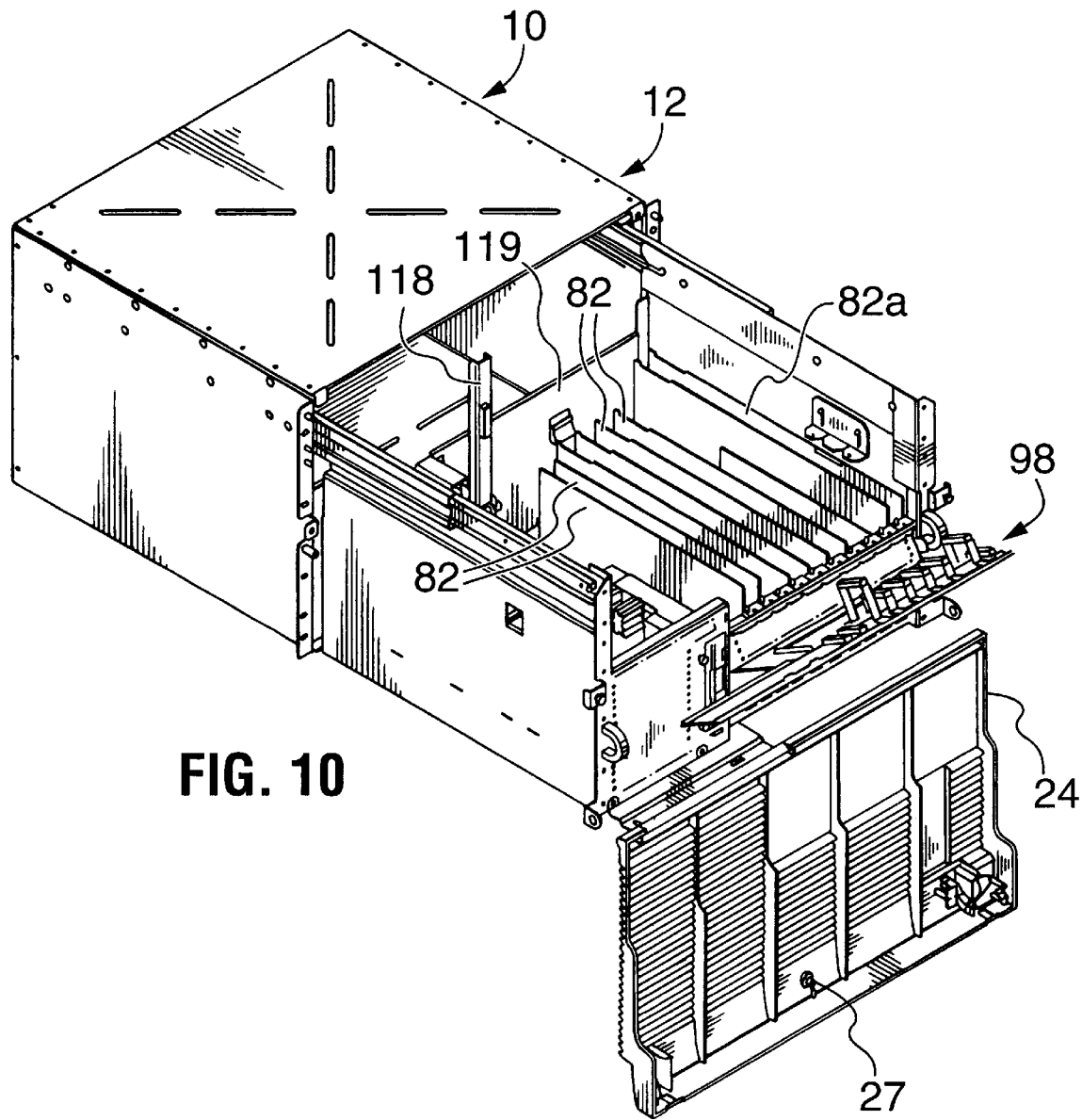
FIG. 10 is an isometric view of the lower carrier mounted in the forward access position, but viewed from the opposite frontal side to that in FIG. 2.

The two carriers 20 and 22 are slidably movable, independently of one another, between retracted use positions (as shown in FIG. 1) and forward access positions in which they extend forwardly from the housing 12. FIGS. 2 and 10 for instance, show the mother board carrier 20 moved forwardly into its access position. The mother board carrier 20 is accessible through its top to enable daughter boards to be accessed for removal and replacement and also ultimately for the mother board to be reached if required. The mounting of the boards within the mother board carrier 20 and their removal will be discussed below.

As shown by FIG. 3, the service carrier comprises two sides 30, a rear wall 32 and an apertured front 34 to define a storage space to house service components for printed circuit boards in the mother board carrier. The apertured front carries a cover 36 for horizontal and forward removal of media disks (not shown) which are located beneath a boot drive 38 carried within the carrier 22. A front wall 40 is disposed in front of a power supply 42 mounted within the service carrier. The cover 36 has thumb screws 44 which upon removal allow the cover 36 to be hinged downwards. The cover 36 and the front wall 40 are provided with a plurality of air inlet apertures 46 (only some of which are shown), the apertures being distributed over the cover and front wall. At the rear of the service carrier 22 are disposed three fan units 48 which are removable vertically from within the carrier, as shown by the left-hand fan in FIG. 3.

In operation of the fan units 48, there is drawn through the louvered front cover through the apertures 46 and through the service carrier to cool the service components for the printed circuit boards in the mother board carrier, the boot drive 38, the power supply 42 and the media disks forming some of these service components. These service components also include, for instance, a LAN access card 50 and an a.c./d.c. power input card 52. Boot drive 38, LAN access card 50 and other service components in the service carrier are removable vertically upwards from within the service carrier.

One object of the construction of the embodiment is to minimize the frontal area of the units 10. So far as the service carrier 22 is concerned the requirement is achieved at least partly by disposing service components with their maximum dimensions extending in a front to rear direction. This is illustrated for example by the positioning of the power supply 42. As will be seen from FIG. 3 the longitudinal direction of the power supply extends in a front to rear direction thereby providing a minimum frontal area of the power supply provided for in the frontal area of the service carrier 22. In addition to this as will also be seen from FIG. 3, the boot drive 38 also extends in a front to rear direction and the cards 50 and 52 lie in planes in a front to rear direction of the carrier. This disposition of the service components also assists in the passage of cooling air through the carrier from the front to the rear as the side surfaces of the components provide straight flow paths for the air while presenting a minimum resistance to flow passage.

Thus, one of the objectives of the present invention is to provide as small a frontal area of the unit as possible as has been illustrated by the disposition of the components within the carrier 22. As will be seen below this design feature for providing minimum frontal area is also taken into account with the mother board carrier 20. In addition, main objectives of the present invention are to provide an electronic unit which provides for easy access to its components for replacement and repair, particularly the mother and daughter boards, and also to minimize the volumetric space required for the arrangement. With such an arrangement, a multitude of the units 10 may be combined together as an assembly, e.g. as shown in stacked arrangement in FIG. 1, while maximizing the density of the electronic components contained by the units in their total assembly.

Figure 7:
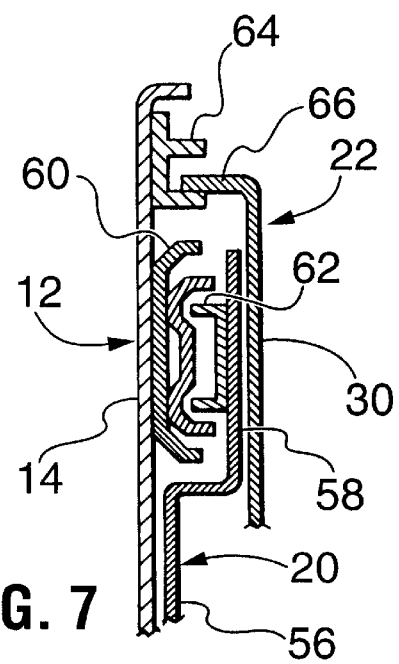
FIG. 7 is a diagrammatic cross-sectional view taken along line VII—VII in FIG. 6.

One manner of helping to achieve a small frontal area for the mother board carrier 20 is accommodated by the design of the mother board carrier itself. As will be seen from FIGS. 2 and 7, the mother board carrier comprises two sides 54 between which a storage space is defined for printed circuit boards which are to be discussed below. The side 54 have upward extensions 56. These extensions extend vertically beyond the containing space for the printed circuit boards within the mother board carrier as shown by FIGS. 2 and 7. The extensions 56 have top end regions 58 which project inwardly of the extensions 56 and towards each other. Parts of mounting means for mounting the mother board carrier into the housing 12 are accommodated within the regions 58. This is shown particularly in FIG. 7 in which each mounting means for the mother board carrier comprises a slider structure 60 carried by the housing 12 and a slider structure 62 carried by the region 58 of the extension with the two slider structures 60 and 62 received one within the other. Hence, the slider structures 60 and 62 extend partly over the plane of each of the sides 54 of the mother board carrier thereby reducing the overall horizontal width for the carrier and its mounting to a minimum. The mother board carrier is movable between its retracted use position and its forward access position by means of the sliders 60 and 62.

The service carrier 22 is of smaller frontal area and is narrower across the front of the electronic unit than the mother board carrier 20. The design is such that the service carrier 22 is contained between the extensions 56 and the upper regions 58 of the walls 54 of the mother board carrier as shown diagrammatically in FIG. 7. For purposes of independent movement between the retracted use and forward access positions of the two carriers, the service carrier 22 is mounted by different mounting means from that required for the mother board carrier. The mounting means for the service carrier 22 comprises at each side of the unit, a carrier slider 64 extending parallel to and above the slider 60 and secured to a side wall 14 of the housing 12. The complementary slider for the slider 64 is provided by an outwardly turned flange 66 of the service carrier 22. This flange 66 extends outwardly from the side wall 30 of the service carrier 22 and over and spaced from the region 58 of the side walls 54 of the mother board carrier. The above structure ensures that the two carriers are movable along front to rear paths independently of one another.

The mother board carrier is limited in its forward movement by the design of its mounting means, i.e. the sliders 62 are only movable forwardly in the slider 60 a predetermined distance before a stop arrangement in the slider design operates to prevent any further forward movement. Stop arrangements which operate in this manner are well known in the slider art, for instance for drawers or cabinets, and require no further discussion. However, because the service carrier 22 is mounted simply by reception of a flange 66 within the slider 64, no such stop arrangement is provided by that slider arrangement. It is desirable, however, that the service carrier can be moved to its forward access position with the mother board carrier in its retracted use position and that there is a limit to the forward movement allowable for the service carrier. Hence, a stop means is provided which operates between the two carriers to limit the forward movement of the carrier 22. In respect of each side wall 30 of the carrier 22, this stop means comprises a leaf spring 70 which extends longitudinally of the side wall. Each leaf spring 70 has an outwardly jutting shoulder 72 as shown in FIG. 4. As the service carrier 22 moves forwardly towards the forward access position, the leaf springs 70 are carried forwardly until the shoulders 72 engage against an abutment provided by an inwardly extending flange 74 of a vertical L-shaped member 76 attached to the corresponding wall extension 56 of the mother board carrier 20.

As may be seen from FIG. 4, a forward end portion 77 of each leaf spring 70 extends forwards beyond the L-shaped member 76 when the service carrier is in its forward access position. These forward end portions 77 are then accessible to be pushed-in manually. This action moves the shoulders 72 inwards towards the sides 30 of the service carrier so as to clear the shoulders 72, thereby allowing for removal of the service carrier from the housing 12. For the L-shaped member 76, see also FIGS. 11 and 12. Depression of the leaf springs 70 allows personnel to wrap their hands around the service carrier for safe transportation to a workbench. For this purpose, handles 79 at the front of the service carrier are useful for extraction of the service carrier only.

The mother board carrier 20 contains a mother board 80 (see FIGS. 13 and 19) which extends in a flat horizontal position in a lower region of the mother board carrier. The location of the mother board in this position minimizes the frontal area of the mother board carrier as the thickness of the mother board, which is presented at the front of the unit, is insignificant and may be virtually ignored when the frontal design and size of the mother board carrier is being established.

A plurality of daughter boards are electrically connected into the mother board 80 and extend upwardly from the mother board as shown particularly in FIGS. 2 and 10 onwards. The daughter boards include a plurality of in/out daughter board cards 82 and a CPU daughter board card 84. The daughter boards as is conventional, are narrower than the mother board and, because of this, the depth of the mother board carrier 20 is minimized, because only the depth of the daughter boards effectively needs to be taken into account when deciding the height of the carrier, it being understood that the side walls extensions 56 extend beyond this effective height and lie alongside the service carrier 22. To assist in the reduction of the frontal area of the carrier 20 to a minimum, the daughter board cards 82 and 84 lie in planes extending from the front to the rear of the mother board carrier. This orientation of the daughter board cards automatically produces desirable straight passages for cooling air which is to be drawn through the unit 10 by the fan units 48.

The cards 82 are provided with incoming cables, to be described, at the fronts of the cards, i.e. at the front of the mother board carrier. Because of this, air cannot be introduced horizontally directly between the cards 82. As a result, the air must be drawn down from the service carrier 22 and between the in/out daughter board cards 82. As shown by FIG. 5, the air entering through the air intake apertures 46 in the cover 36 and the front wall 40 is directed partly horizontally through the service carrier as described above. However, some of the air passing through the cover 36 and front wall 40 is directed downwardly by an inclined baffle 86 positioned in front of the power supply unit 42. This downwardly directed air passes through an aperture 90 in a bottom wall 92 of the service carrier to pass between the cards 82. The cooling air then passes upwards through another aperture 94 in the bottom wall 92 before being drawn through the fan units 48 and out from the unit 10. Air for cooling the CPU card 84, memory components and other ancillary components mounted upon the mother board is drawn through perforations 99 on the mother board carrier front. Air into the mother board carrier is also enabled by the fact that the top of the mother board carrier is completely open as may be seen from the figures. This allows for access to the daughter board cards 82 and 84 for ease of removal vertically upwards through the open top of the mother board carrier so that selected daughter board cards may be removed as required. With the mother board carrier in the access position, as shown for instance by FIG. 2, and with the service carrier 22 in its retracted use position, it follows that removal of any of the boards from the mother board carrier is not restricted or hampered by the location of service components.

Figure 11:
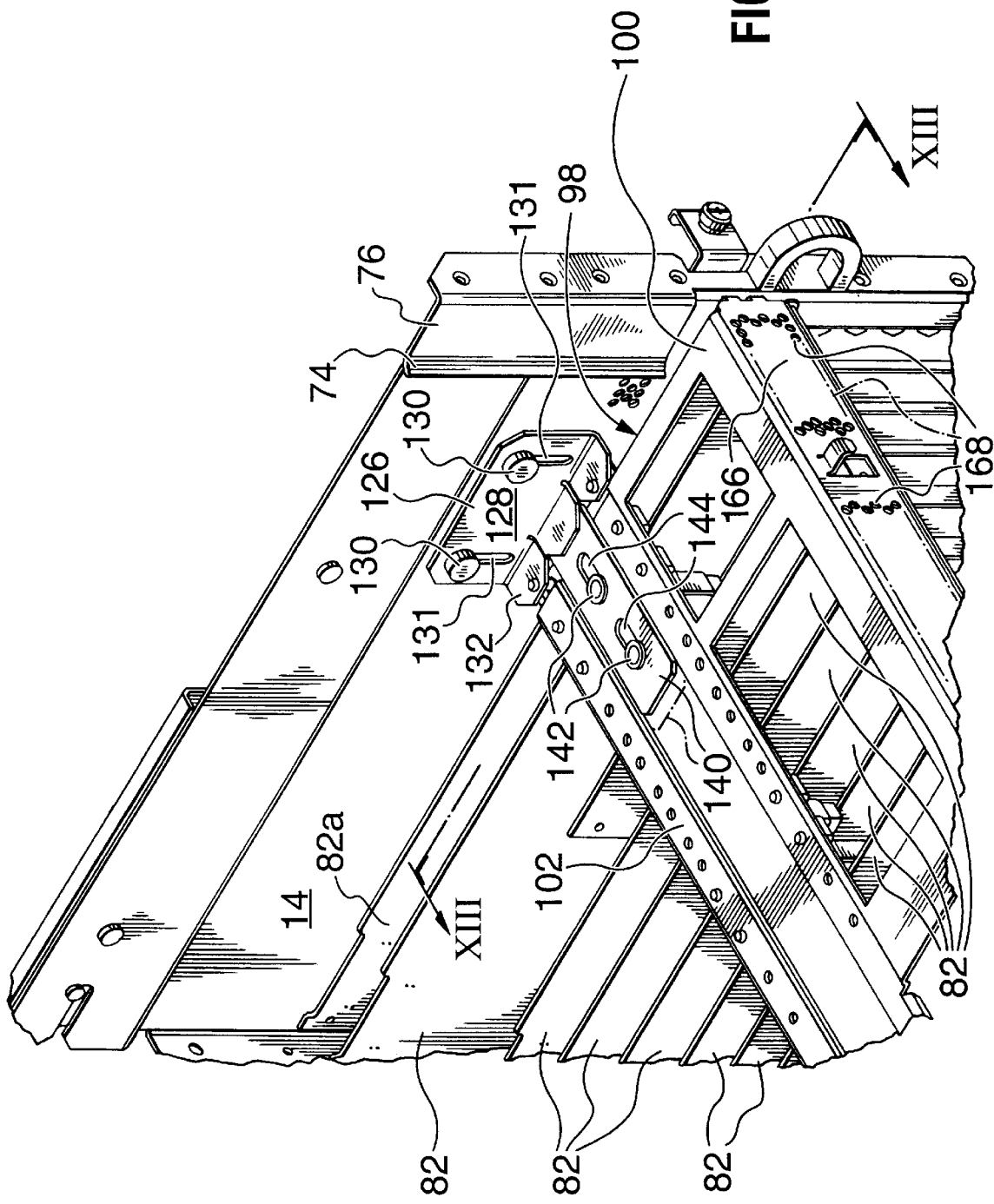
FIG. 11 is an isometric view of part of the lower carrier taken in the same direction as FIG. 10 but to a larger scale.
Figure 18:
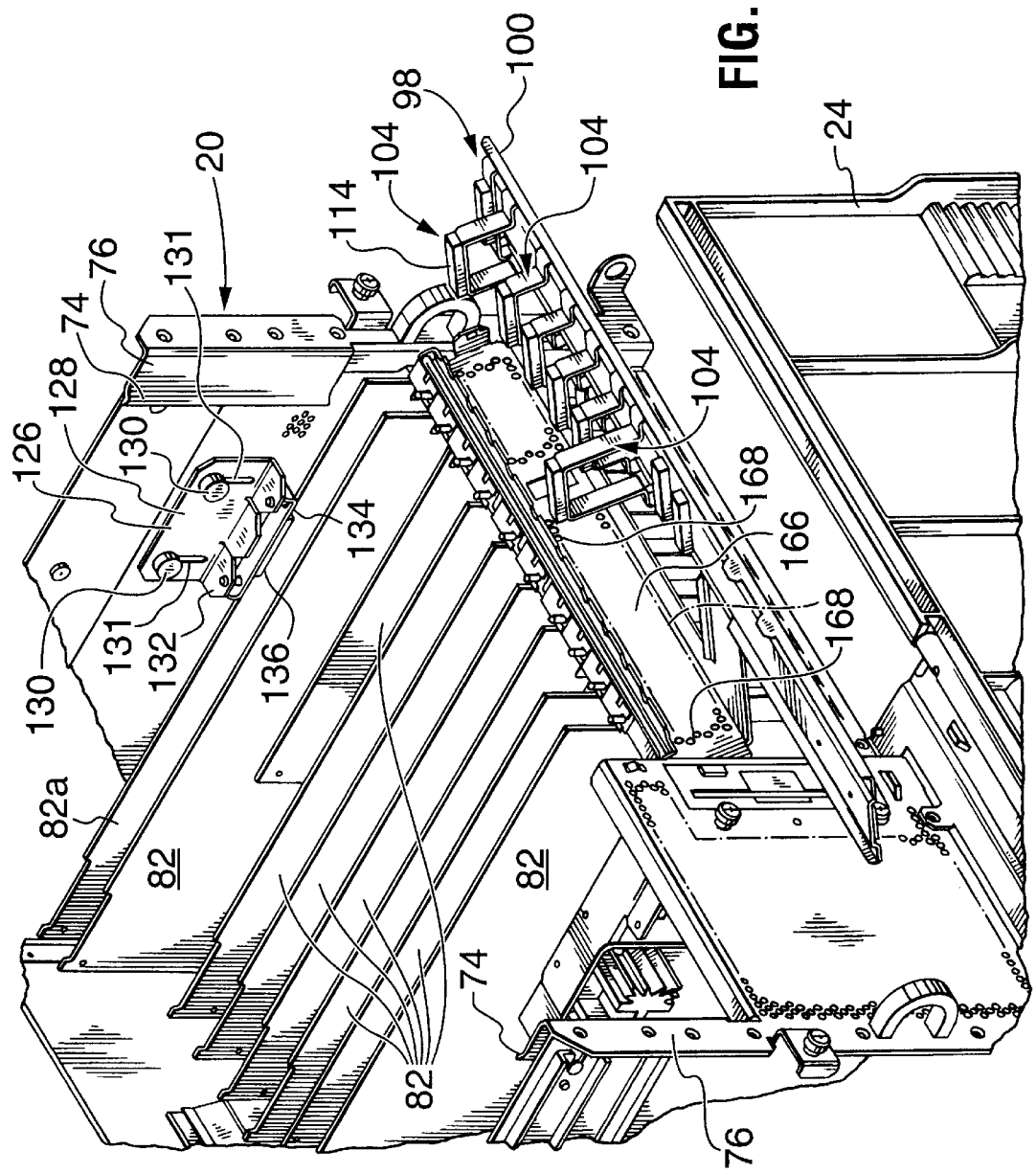
FIG. 18 is a view similar to FIG. 11 showing parts of the lower carrier in different relative positions.
Figure 19:
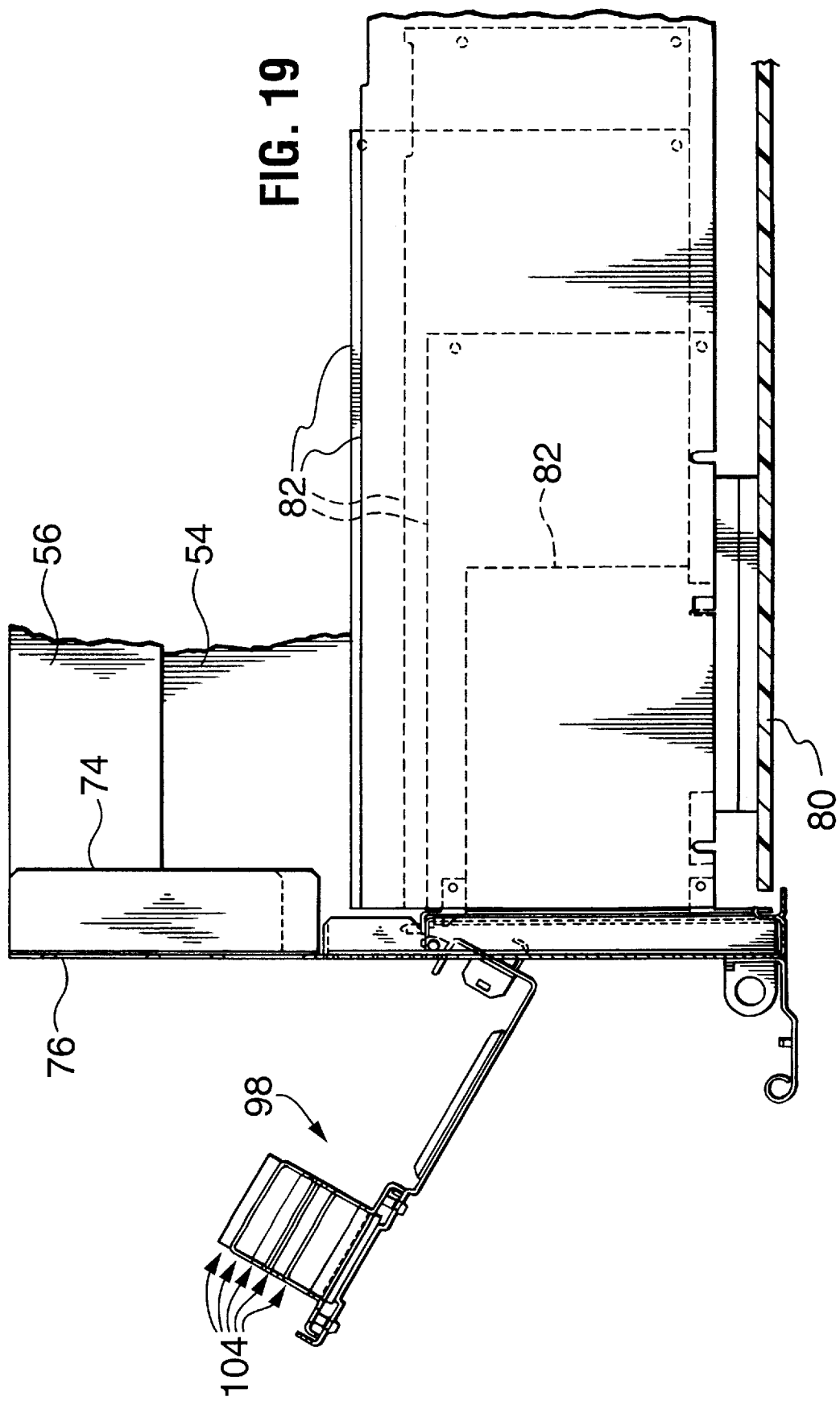
FIG. 19 is a view similar to FIG. 13 and shows parts of the lower carrier in the positions of FIG. 18.

The daughter board cards 82 and 84 are located in position in a particularly novel way to allow for positive individual securing in position of each card and for quick access to each card for removal purposes. Structure for this is illustrated in FIG. 10 and particularly in FIGS. 11 to 19. A daughter board holding means, indicated generally at 98 in these figures, holds all of the daughter board cards in receiving stations in the mother board carrier in which they are in fixed desired vertical positions and in electrical engagement with the mother board. This holding means comprises a card restraint bar 100 which extends across the front of the mother board carrier and is pivotally movable to the front of the carrier between a daughter board holding position (FIGS. 11, 12 and 13), and a release position as shown in FIGS. 10, 18 and 19. The restraint bar 100 needs to take into account a requirement for holding, positively in position, daughter board cards of different heights, i.e. vertically above the mother board, so as to retain each daughter board card in electrical contact with the mother board and without movement. This particular provision is of utmost importance for preventing vibrational displacement during transporting the finished electronic unit, but also is employed in use of the unit to assist in holding the daughter boards in position. For this purpose, the restraint bar 100 has an elongate element 102 of length sufficient for it to extend substantially from one side wall 54 to the other (compare FIGS. 11 and 12). The elongate element 102 carries a plurality of detachable U-shaped holding members 104 (FIG. 14), one holding member for each of the daughter board cards 82, except for an end card 82a as shown in FIGS. 18. Each of the U-shaped holding members 104 is disposed vertically above a respective daughter board card 82. Each holding member 104 has a base 106 and two arms 108 extending upwardly from the base, each arm terminating in an outwardly extending flange 110 at its upper end. These flanges 110 are detachably connected to the elongate element 102 by mechanical quick-release clips 112 of any preferred construction. Alternatively, a screw-threaded arrangement (not shown) may be used to secure the flanges 110 to the elongate element 102. Holding members 104 are thus removable and replaceable upon the elongate element 102 and when disposed in position are spaced laterally apart along the elongate element 102. Each holding member 104 is chosen to be of appropriate vertical depth so that when the restraint bar 100 is in the holding position as shown in FIG. 11, the base 106 of the holding member is disposed slightly above the upper edge of its associated daughter board card 82, whereby a compressible layer 114 (FIG. 14) is compressed against the upper edge of the card. This compressible material may be of any suitable construction and in this case is foam rubber. In the daughter board holding position of the holding means as shown by FIG. 13, each of the holding members 104 lies substantially above connectors 116 between the daughter board cards 82 and the mother board so as to apply pressure directly downwards to maintain positive electrical continuity.

Figure 12:
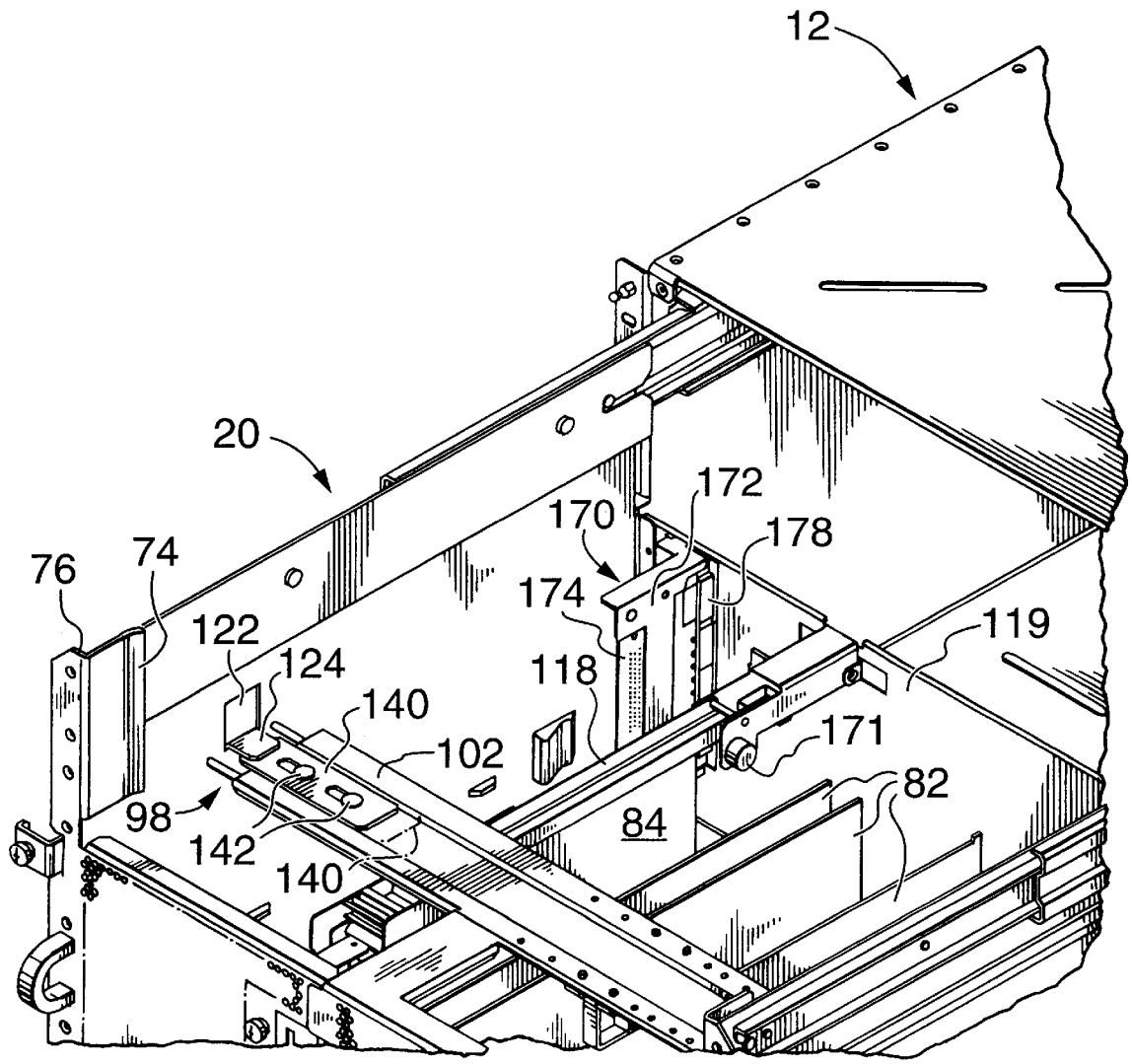
FIG. 12 is an isometric view of another part of the lower carrier and also of larger scale than in FIG. 10.
Figure 13:
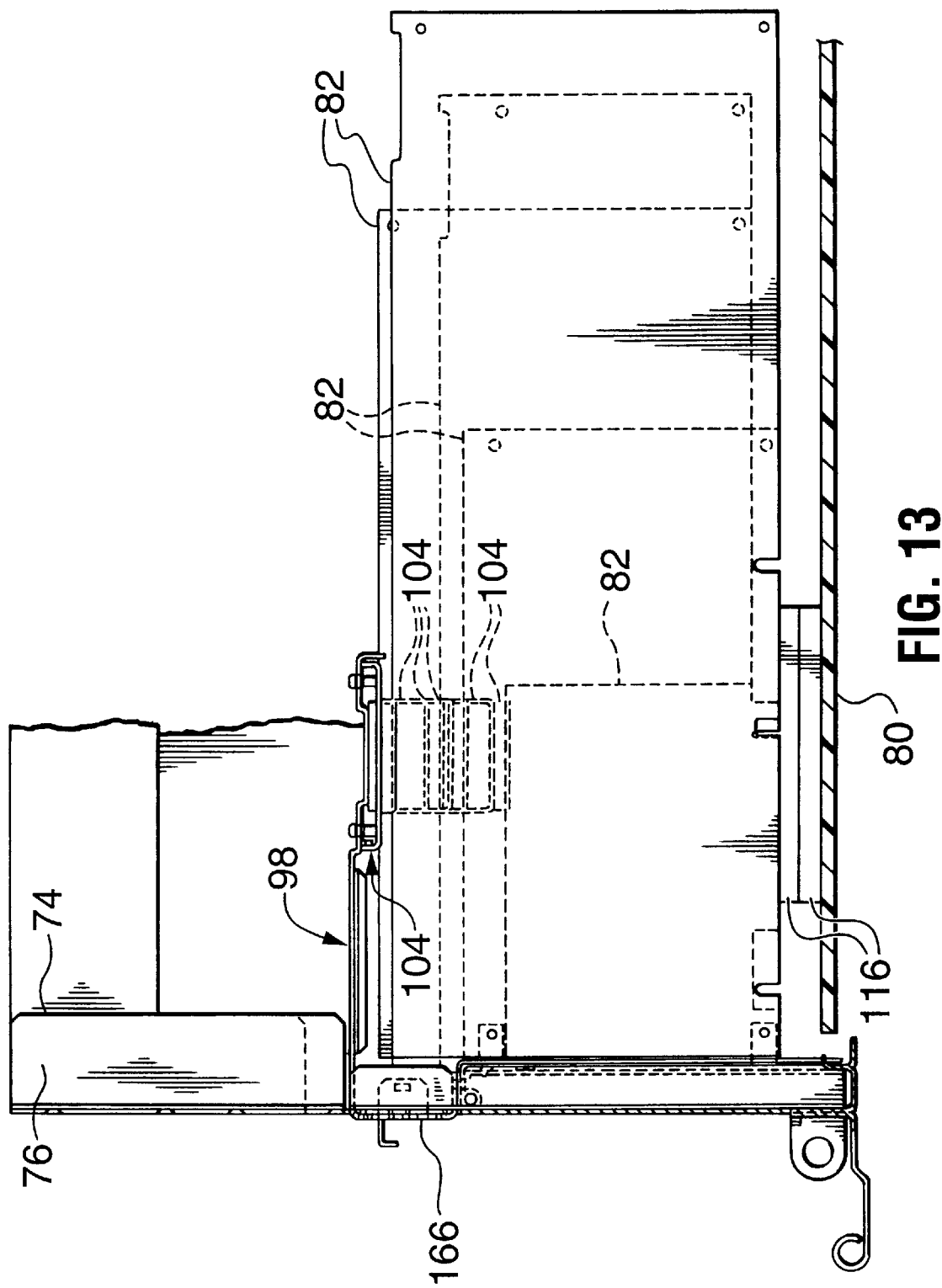
FIG. 13 is a cross-sectional view taken along line XIII—XIII in FIG. 11, with parts omitted for clarity.

One of the printed circuit boards, namely the CPU card 84, does not have its interconnection with the mother board in the location shown generally in FIG. 13. In the case of the CPU card 84, the mating connectors between that card and the mother board lie further towards the rear of the mother board carrier, i.e. along the CPU card. For the purpose of providing downward pressure upon the CPU card directly above the position of its mating connectors with the mother board, a secondary restraint bar 118 is employed. This prevents vibrational displacement of the CPU card 84 during transporting. The secondary restraint bar is disposed in use, as is seen from FIG. 2, extending in a forward to rear direction of the mother board carrier. This secondary restraint bar is pivoted at a rear end to a rear wall 119 of the mother board carrier and is pivoted into a downward horizontal use position in which it lies parallel to the upper edge of the CPU card 84 and is held in this down position by lying beneath one side of the elongate element 102 when the element 102 is in its holding position shown in FIGS. 2, 11 and 12. The secondary restraint bar 118 carries beneath it and as shown by FIG. 2a, a compressible layer 120 of material which is compressed against the upper edge of the CPU card. This compressible layer may be of the same material as the compressible layers 114 carried by the holding members 104.

The restraint bar 100 is held in its daughter board holding position by two brackets disposed, one at each end of the elongate element 102, these brackets being attached one to each of the side walls 54 of the mother board carrier. One of these brackets 122, as shown in FIG. 12, has a short leg 124 jutting partly over the storage space for daughter boards in the mother board carrier. The other bracket 126, and as shown by FIGS. 11 and 18, is also L-shaped with one leg 128 attached to its respective side wall 54 by the reception of two thumb screws 130 through vertical slots in the leg 128. By this means, the bracket 126 is adjustable vertically by manual operation of the thumb screws. The bracket 126 also has a horizontal leg 132 of complex design and which lies directly over the daughter board card 82a (see particularly FIG. 18). The bracket 126 has a daughter board holding position as shown in FIG. 11 and a position released from the holding position in which the thumb screws 130 are loosened thereby enabling the bracket to be moved vertically upwards by virtue of the reception of the thumb screws within the slots 131. The daughter board card 82a may then be removed from the mother board for replacement purposes if required. Beneath the flange 132 is disposed a holding member 134 which is basically of similar construction to the holding members 104 and has a compressible layer 136 attached beneath it. In the holding position, the bracket 126 bears downwardly towards the daughter board card 82a and the compressible layer 136 is compressed against the upper edge of the card 82a to hold it firmly in position in engagement with its mother board.

The restraint bar 100 has a quick-release to enable it to be removed from its holding position and to be returned thereto as required. This quick-release comprises a structure at each end of the elongate element 102 and as shown in FIGS. 11 and 12. Each quick-release structure comprises a latch 140 which is slidably movable upon the end of the element 102, the latch being movable against frictional grip provided by two pins 142 secured to the elongate element 102 and extending through slots 144 directed longitudinally of the latch 140. Frictional resistance to latch movement is such as to be easily overcome by manual pressure applied against the latches to move them between a locking position as shown in full outline in FIGS. 11 and 12 and a released position as shown in dotted outline for the latches 140. In the release position the latches are disengaged from beneath the legs 120 and 132 of the brackets 122 and 126 to enable the restraint bar 100 to be pivotally moved forwardly and upwardly out of its daughter board holding position of FIGS. 11, 12 and 13 and into its release position shown in FIGS. 18 and 19.

Figure 14:
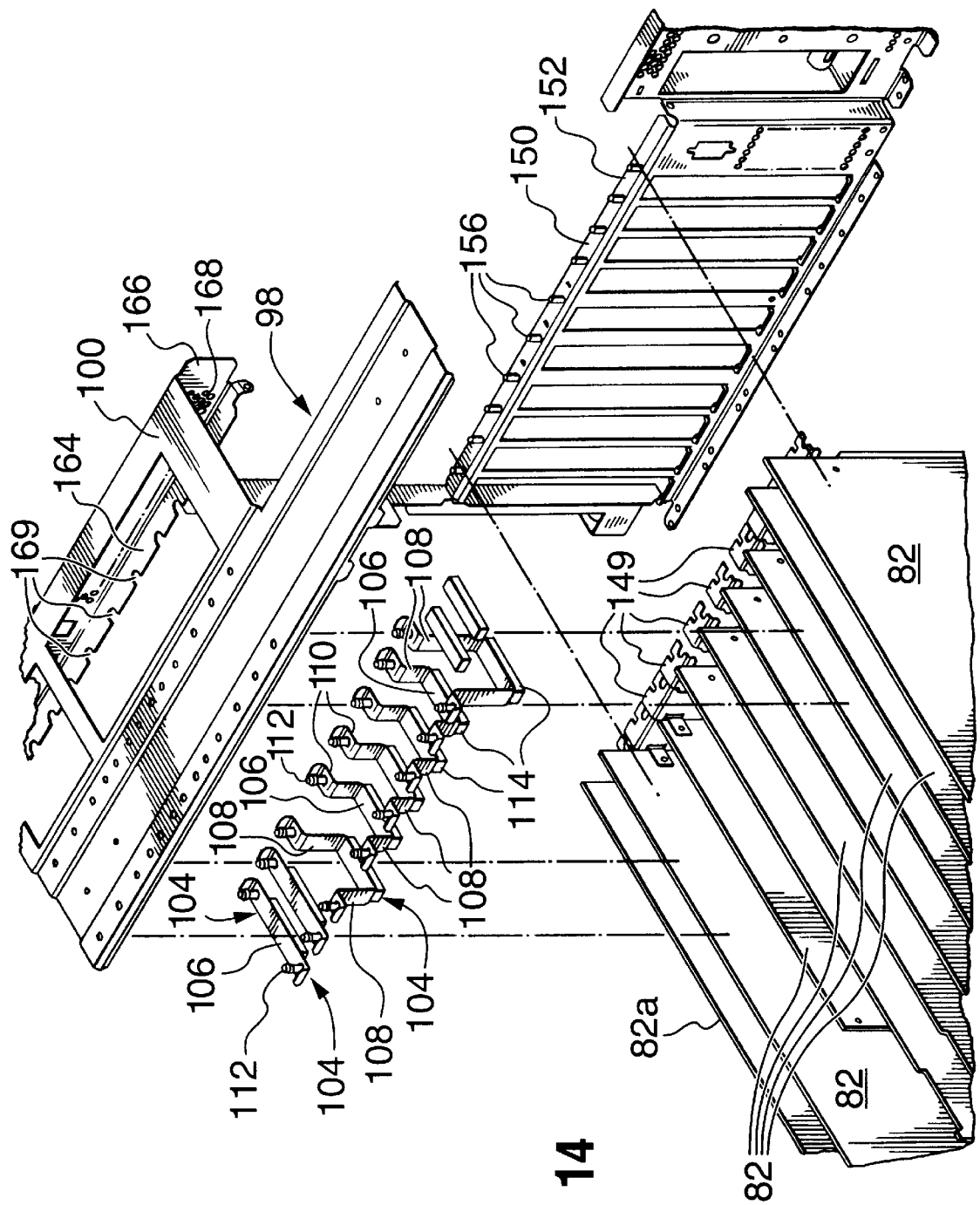
FIG. 14 is an exploded isometric view of part of the lower carrier looking forwardly.

The daughter board cards 82 and 82a are retained in fixed positions in the mother board carrier by the restraint bar 100 in yet a further manner. As may be seen from FIGS. 14 and 15, each of the cards 82, 82a carries along its forward edge an upwardly extending face plate 146 which is attached to the board at two riveted positions 148. The upper end of each face plate has a forwardly directed short flange 149 which, as shown in FIGS. 16 and 17, extends over and in contact with an upwardly facing abutment surface 150 provided by a horizontal forwardly extending flange 152 of a front wall of the mother board carrier. This flange 152 is also shown clearly in FIG. 14. Cooperable registration means are provided which are associated with the flanges 149 and 152 to positively retain the face plates 146 and their respective daughter board cards 82 and 82a in their desired fixed relative positions. In the case of each card 82, 82a, the registration means comprises a lateral slot 154 extending into one side of the flange 149 and this slot is registered by an upwardly extending registration or alignment pin 156 secured to the flange 152. The registration means for each daughter board card 82, 82a also includes an upwardly dimpled surface portion 158 of the surface 150. Side edges of the dimpled portion 158 are engaged by the edges of a rearwardly extending slot 160 provided in the flange 149, the slot 160 lying normal to the slot 154. One of these edges 162, as shown by FIG. 17, is turned downwardly so as to engage the abutment surface 150 and to cut into the abutment surface to provide a positive electrical ground contact when downward pressure is applied to the flange 149. This downward pressure is applied by a flange 164 of the restraint bar 100, the flange 164 extending rearwardly from a vertical forwardly facing part 166 of the bar 100. This forwardly facing part 166 is provided with air inlets 168 as shown in FIG. 14 to assist in drawing cooling air through the mother board carrier and between the daughter board cards 82 and 82a. The flange 164 is formed with slots 169 which correspond in position to the spaced apart alignment pins 156 so as to extend around the pins with the restraint bar in its daughter board holding position.

To load the mother board carrier 20 with the mother board and all of the daughter boards, the mother board carrier is located in its forward access position and with the restraint bar 100 pivoted forwardly as shown in FIG. 10 into its daughter board release position. The secondary restraint bar 118 which has been released by the restraint bar 100 extends vertically upwards to allow for insertion of the CPU card 84. Before the mother board can be placed into position, a connector means 170 in one rear corner of the carrier, needs to be removed (FIGS. 2 and 12). The connector means 170 will be described below. The mother board 80 is then placed into its horizontal position at the bottom of the mother board carrier. The daughter board cards are then inserted downwardly into their receiving stations in the mother board carrier. During this downward movement, each of the cards 82 and 82a registers its slot 154 with the associated alignment pin 156 until the flange 149 contacts the abutment surface 150 (FIGS. 15 and 16). This terminates the downward movement of the card. At this point the daughter board card is possibly movable out of its vertical plane because the slot 154 is movable slightly along the pin 156. This movement is performed until the respective dimple portion 158 of the surface 150 engages with the slot 160. This then correctly locates the daughter board card in a fixed vertical position in which it lies engaged electrically with the mother board.

To hold the daughter board cards in their fixed positions, the secondary restraint bar 118 is first moved downwardly from the position in FIG. 10 to its holding position shown in FIGS. 2 and 12. The restraint bar 110 is then pivoted upwards and rearwardly into its holding position of FIGS. 11 and 12 in which the restraint bar 102 overlies and firmly contacts the restraint bar 118 to cause it to apply downward pressure on the CPU card 84 to accurately locate it in position. With the latches 140 withdrawn to their chain-dotted positions of FIGS. 11 and 12, and the restraint bar 100 is disposed at its holding position, manual pressure is applied longitudinally of the latches. This moves these latches against the frictional load imposed by the pins 142 to insert the latches beneath the legs 124 and 132 to hold the restraint bar 100 in the holding position. In this position, all of the daughter board cards are held accurately in their fixed vertical positions. It is worthy of note, that during the pivoting movement of the restraint bar 100 into the holding position, the flange 164 descends over the flanges 149 to apply downward pressure upon the flanges while the alignment pins 156 engage within the slots 169 of the flange 164. This pressure ensures that the dimpled portions 158 of the surface 150 engage accurately within the slots 160 to prevent any sideways movement of the board 82 and 82a. The downward pressure also causes the downwardly turned edge 162 to bite into the surface 152 to provide positive electrical ground contact with the mother board carrier for grounding of the daughter board card. The mother board carrier may then be moved rearwardly to its retracted use position.

If it is required to replace any daughter board card, then the mother board carrier 20 is merely moved forward into its access position of FIG. 2, followed by the manual release of the restraint bar 100 by manual operation of the latches 140. Forward pivoting movement of the restraint bar 100 into the position of FIGS. 18 and 19 removes the downward pressure caused by the holding members 104 and also causes the release of the flange 164 from the flanges 149 of the face plates. Any desired daughter board card 82 may then be removed for replacement purposes. Removal of the daughter board card 82a is accomplished by manually loosening the thumb screws 130 to raise the bracket 126 to give clearance for upward movement of the daughter board 82a. Should it be required to remove the CPU card 84, then the secondary restraint bar 118 is also pivoted into its vertically upward position as shown for instance by FIG. 10. The bar 118 is retained in the vertical position, by tightening a thumb screw 171 (FIG. 12).

As may be seen from the above embodiment, the invention provides for ease of access of printed circuit boards without the presence of service components hindering this accessibility. In addition to this, the structure is such that removal and reinsertion of circuit boards is a simple operation and the structure is such that positive location of the daughter board cards is performed by a holding means. This holding means not only accurately locates the daughter board cards correctly in position in engagement with the mother board but also holds the daughter board cards in two locations for this purpose, i.e. along an upper edge of each card so as to apply downward pressure upon the electrical connector area with the mother board and also by accurately securing the face plate in its required position.

Also, the structure is such that all insertion and removal of daughter board cards within the mother board carrier is performed merely by loosening and tightening of thumbscrews, e.g., thumbscrews 130 and the manual movements of the latches 140. Further, the cover 24 is manually removable against the grip of ball studs 26 and the latch 27. Also, the cover 36 is held by thumbscrews and thumbscrews are used to hold service components in the service carrier 22.

The invention also provides, in addition to all the above advantages, a structure which eliminates the problem of electrical conductors or cables extending from one carrier to the other and which could complicate insertion and removal of either the printed circuit boards in the one carrier or in removal of the service components in the other. It would normally be expected for a long length of cable or conductor harness to extend between the two carriers to enable each carrier to be moved forward independently of the other carrier to its forward access position. However, the present invention avoids such a problematic construction.

Figure 9:
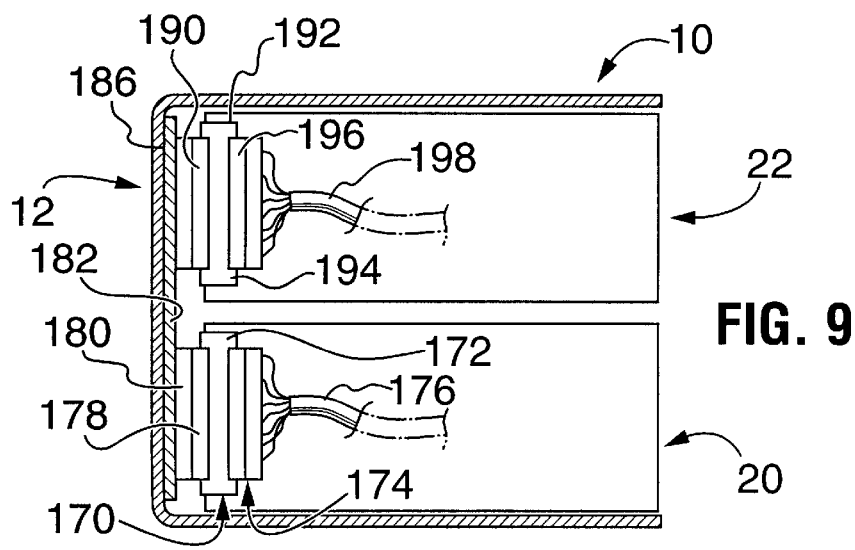
FIG. 9 is a diagrammatic cross-sectional view taken along line IX—IX in FIG. 8.

As may be seen from FIGS. 2 and 12, the mother board carrier comprises the connector means 170 in one rear corner of the carrier. This connector means, as is shown diagrammatically in FIG. 9, comprises a printed circuit board 172 connected at a forward end to a vertical connector 174 which is electrically connected by a conductor harness 176 to desired electrical terminals within the mother board carrier. At its rear end, the printed circuit board 172 has a vertical connector 178. With the mother board carrier in its retracted use position as shown in FIG. 9, the connector 178 is engaged with a forwardly facing connector 180 (also FIG. 8) mounted upon a vertically extending printed circuit board 182 secured to the housing 12. Guide pins 184 on the connector 180 are provided to guide the connectors 178 and 180 into alignment for connection purposes. At the top of the printed circuit board 182 another connector 186 is provided and this has guide pins 188. This connector 186 engages with a rearwardly facing connector 190 of a connector means 192 of the service carrier 22 with the service carrier in its retracted use position as shown by FIG. 9. The connector means 192 also comprises a printed circuit board 194 having the connector 190 at its rear end and a further connector 196 at its front end. This connector 196 has extending from it a conductor harness 198 for distribution of conductors to various service components which need to be in electrical contact with the printed circuit boards in the mother board carrier.

It follows from the above description, that the mother board and service carriers are electrically connected together for use purposes only when both carriers are in their retracted use positions, i.e. when the connectors 178 and 190 electrically engage the connectors 180 and 186. As may be seen therefore there is no cable or conductor or conductor harness arrangement extending loosely from one carrier to the other and which would need to flex as the carriers are moved between their use and access positions. The only conductors which are contained within the housing 12 are those which are held solely within each carrier 20 or 22, namely the harness 176 or 198 as shown in FIG. 9. This results in an extremely neat and simple layout of the total structure while performing all of its required electrical functions. It is worthy of note, that with either of the carriers moved to its forward access position, electrical connection between components in one carrier and components in the other carrier is completely discontinued because connection into the circuit board 182 has been discontinued. However, electrical continuity between the two carriers with one of the carriers in the forward access position should not, in any case, be required, because maintenance procedures are being performed on that carrier.

Figure 20:
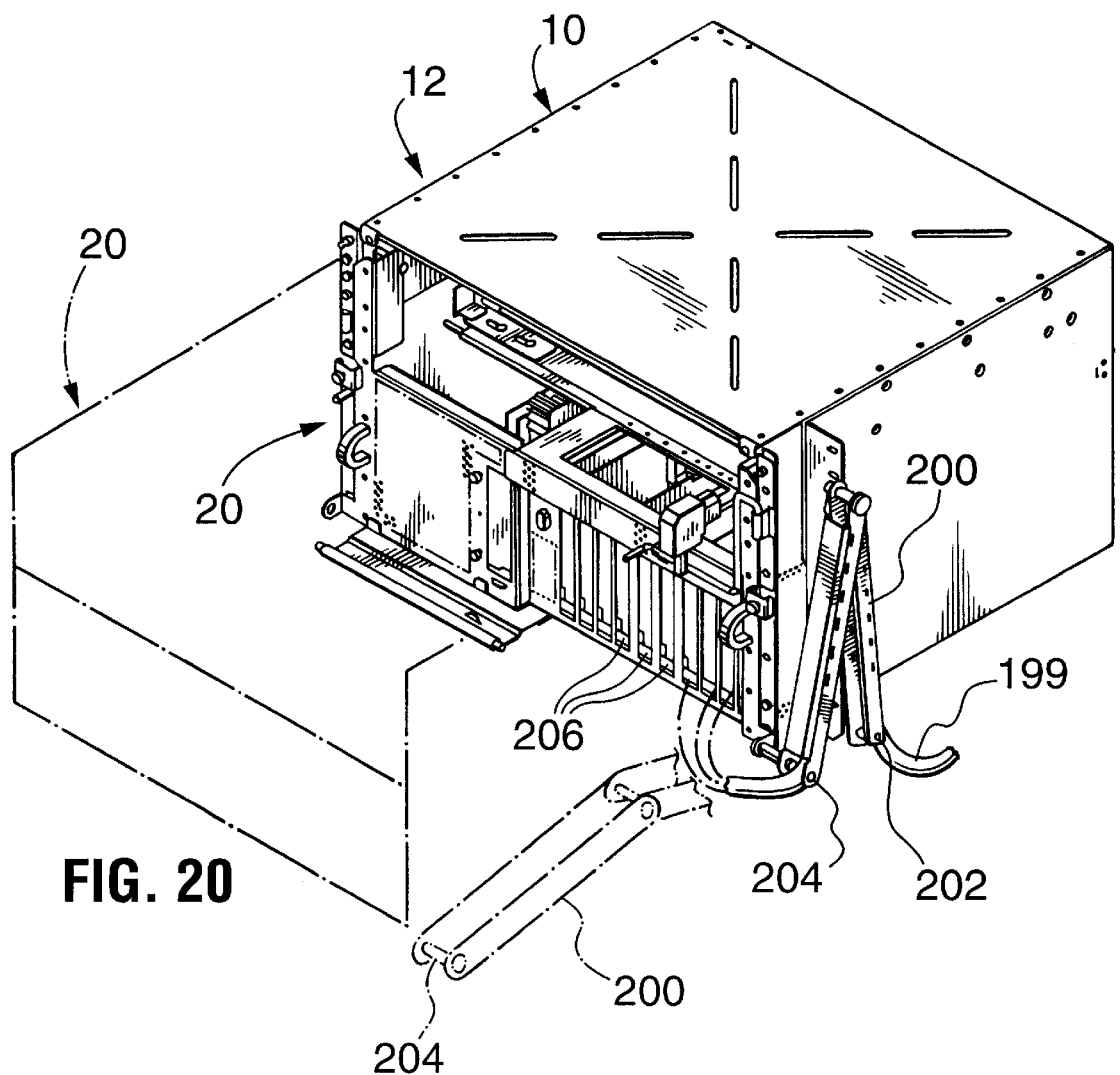
FIG. 20 is a view similar to FIG. 2 with the parts of the lower carrier in the positions shown in FIG. 18.

Simplicity provided to the structure by the avoidance of flexible cables within the housing 12 is assisted by the manner in which cable is brought to the unit 10 from an electrical source. As may be seen from FIG. 20, incoming cable 199 extends around an articulated arm structure 200 which, with the mother board carrier 20 in its retracted use position, extends vertically upwards from a lower pivot position 202 of the housing 12. The other end of the articulated arm is secured at pivot position 204 to allow a corner of the mother board carrier to direct the cable towards the front of the mother board carrier for cable connection at the front of the mother board carrier at positions 206. As shown chain-dotted in FIG. 20, with the mother board carrier moved forwardly into its access position the articulated arm is moved towards a straight horizontal position while still controlling the incoming cable as it is directed to the cable input positions 206.

In modifications, an articulated arm structure similar to structure 200 may be placed instead on the other side of the housing 12 or even beneath the housing.

Figure 21:
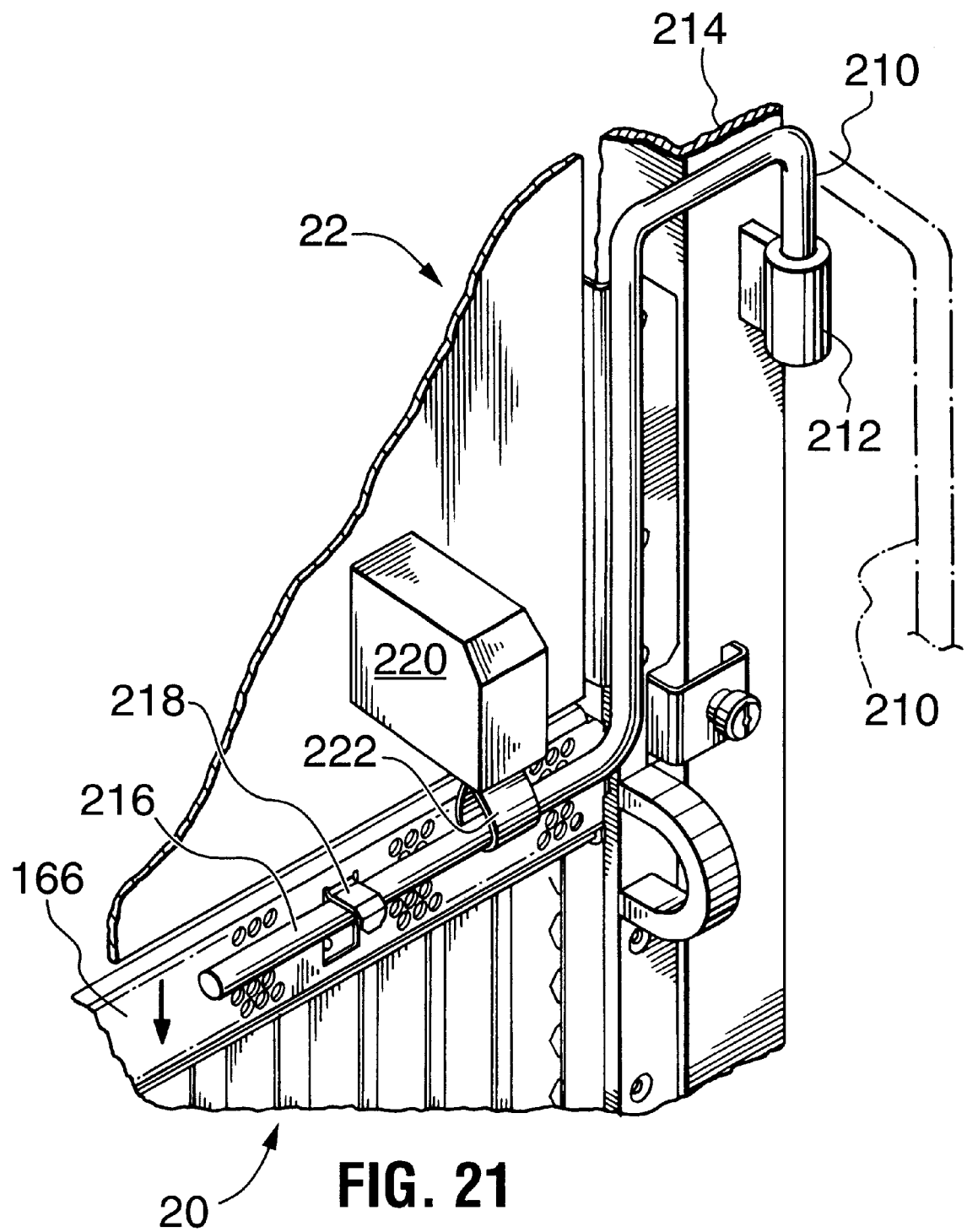
FIG. 21 is a view similar to FIG. 11 and showing other details.

One other feature that the structure of the embodiment possesses is concerned with ensuring neither of the mother board and service carriers is movable into its forward access position until power is present in the structure. This is made possible by the use of a power safety bar 210 as shown in FIG. 21. This bar is omitted from some at least of the other figures for purposes of clarity.

The bar 210 is pivoted at an upper end about a vertical axis in journal 212 which is carried by a flange 214 of the front of the housing 12 in line with the service carrier 22. The bar extends downwards to one side of the path of the service carrier, as it moves into its forward access position, to continue as a horizontal lower end region 216. This end region 216 extends in front of one side of the forward facing part 166 of the bar 100 and passes beneath an L-shaped bar retaining clip 218 which is pressed forwards from the forward facing part of the bar 100. With the safety bar 210 in this location as shown by FIG. 21, it is impossible to move the mother board carrier forwards into its access position because of the restraint of the bar 210. To allow the mother board carrier to be moved forwardly, the bar 210 must be released from the retaining clip 218 by resiliently flexing the bar downwards in the direction of the arrow in FIG. 21. The bar is then pivoted forwards about its vertical axis in the journal 212 to the chain-dot position in FIG. 21 so as to remove it from the path of movement of the mother board carrier.

However, a power input connector 220 is plugged into the front face of the service carrier 22. The front face of the service carrier 22 is shown in FIG. 21 with complete lack of detail. The connector 220 is tied to the safety bar 210 by a binding 222 which is sufficiently slack to allow linear movement of the connector for connection and disconnection purposes while the bar pivots slightly about its upper end. It follows that the service carrier 22 cannot be moved into its forward access position with the power connector 220 connected to it. Thus the connector 220 needs to be disconnected to allow for the safety bar to be released from the clip 218 so as to pivot the safety bar forwards to allow either carrier to be moved into its forward access. Neither carrier can be moved out of its retracted use position until power has been cut-off from the assembly.

What is claimed is:

1. An electronic unit comprising: a support structure having a front and a rear;
    a mother board carrier supported by the support structure and having a printed circuit board storage space; and
    a service carrier supported by the support structure, the service carrier having a service component storage space to service printed circuit boards to be received in the mother board carrier;
    the mother board carrier having, within the printed circuit board storage space, a horizontal mother board mounting position and daughter board receiving stations extending upwards from the horizontal mother board mounting position; and
    each carrier being individually accessible at the front of the support structure while both carriers are in retracted use positions within the support structure, and each carrier having an individual mounting means and being movable independently upon its individual mounting means between its retracted use position and an access position forwardly of the support structure to provide access to its storage space, while the other carrier remains in its retracted use position within the support structure.

2. An electronic unit according to claim 1 wherein the mother board carrier is mounted vertically below the service carrier and one of the carriers has a containing space with a greater lateral dimension than the other of the carriers, and the carrier with the greater lateral dimension to its container space has laterally spaced sides provided with extensions which extend vertically beyond its container space to movably mount the greater lateral dimension space carrier to the support structure, and the carrier with the smaller lateral dimension to its container space is disposed between said extensions to the sides.

3. An electronic unit according to claim 2 wherein the extensions to the sides have end parts which project laterally inwards towards each other and mounting means for mounting the carrier with the said greater lateral dimension within the support structure are carried by the end parts of the extensions.

4. An electronic unit according to claim 2 wherein the mother board carrier has said greater lateral dimension and the service carrier has mounting means which extend over the tops of said extensions to the sides of the mother board carrier so as to mount the service carrier to the housing independently of the mother board carrier.

5. An electronic unit according to claim 4 wherein the two carriers have cooperable movement stop means which cooperate with the mother board carrier in either of its use or forward access positions to prevent the service carrier from moving in the support structure forwardly beyond a determined position relative to the mother board carrier.

6. An electronic unit according to claim 2 wherein the mother board carrier carries a plurality of conductors extending from electrical terminals in the mother board carrier to a first electrical connector means carried by the mother board carrier, and the first connector means is electrically interconnected with a second connector means carried by the support structure, said electrical interconnection provided only when the mother board carrier is in the retracted use position, and a third connector means is mounted in the service carrier, the third connector means being electrically connected to a fourth connector means carried by the support structure, said electrical connection to the fourth connector means being provided only with the service carrier in the retracted use position, and the second and fourth connector means being electrically interconnected whereby the mother board carrier is electrically connected to the service carrier only when both carriers are in their retracted use positions.

7. An electronic unit according to claim 2 wherein an access is provided at the front of the mother board carrier for connecting electrical conductors to daughter boards when these are mounted in daughter board receiving stations in the mother board carrier, a cooling air inlet means is provided at the front of the unit at a position above the daughter board receiving stations, and a baffle means is located behind the cooling air inlet means to direct cooling air at a front region of the mother board carrier and through the daughter board receiving stations, so as to pass the cooling air between the daughter boards when mounted therein.

8. An electronic unit according to claim 7 wherein the baffle means is carried by the service carrier and is inclined to direct cooling air down through the daughter board receiving stations.

9. An electronic unit according to claim 8 wherein the service carrier is provided with at least one air cooling fan at a rear of the carrier, the cooling fan interconnected with the mother board carrier to draw cooling air upwardly from the receiving stations at a rear region of the mother board carrier.

10. An electronic unit according to claim 1 wherein the mother board carrier includes a daughter board holding means movable into and out of a daughter board holding position in which it extends transversely over the daughter board receiving stations and is removably secured in position to retain a plurality of daughter boards in their receiving stations.

11. An electronic unit according to claim 10 including a plurality of daughter boards for location in daughter board receiving stations, each daughter board having a face plate and the face plate and the mother board carrier having cooperable registration means to detachably dispose the daughter boards in desired fixed vertical positions.

12. An electronic unit according to claim 11 wherein, in front of the receiving stations and spaced above the mother board mounting position, the mother board carrier has an upwardly facing abutment surface, and each of the face plates has a flange for abutting reception upon the abutment surface when the respective daughter board is in its receiving station, and the registration means is provided partly upon the abutment surface and partly by the flange.

13. An electronic unit according to claim 12 wherein the registration means comprises a raised portion of the abutment surface and opposing edges of the flange which engage edges of the raised portion for registration purposes and with the raised portion extending into an opening in the flange and defined between the opposing edges.

14. An electronic unit according to claim 13 wherein a guide is provided for the flange of the face plate to direct movement of the face plate and of the daughter board into the fixed vertical position in which the raised portion of the abutment surface is engaged between the opposed edges of the flange.

15. An electronic unit according to claim 14 wherein the guide comprises a slot in the flange and a guide pin extending upwardly from the abutment surface, the flange extending transversely of the plane of the daughter board to permit entry of and movement of the pin along the slot with the daughter board in its receiving station and moving angularly into its desired vertical position.

16. An electronic unit according to claim 14 wherein the daughter board holding means comprises a restraint bar which is movable into and out of a holding position in which it acts downwardly upon the flanges of the face plates to press the face plates down onto the abutment surface and retain the registration means in mutual cooperation to retain the daughter boards in their fixed vertical positions.

17. An electronic unit according to claim 16 wherein each flange of each face plate has a downwardly facing edge which is urged into electrical ground contact with the abutment surface with the restraint bar in the holding position.

18. An electronic unit according to claim 16 wherein the restraint bar also includes a longitudinally extending bar portion for positioning transversely across the daughter boards, with the restraint bar in the holding position, for urging the daughter boards towards the mother board.

19. An electronic unit according to claim 16 wherein the restraint bar has a quick-release to enable it to be removed from its holding position.

20. An electronic unit according to claim 19 wherein the restraint bar has two ends and, at each end, the quick-release comprises a latch which is movable into and out of a locking position in which it engages beneath a latching surface to retain the bar in its holding position.

21. An electronic unit according to claim 18 wherein the restraint bar has a pivotal mounting to move it into and out of its holding position.

22. An electronic unit according to claim 18 wherein the restraint bar is a first restraint bar and a second restraint bar is provided, the second restraint bar provided for movement into a holding position in which it extends along an upper edge of a respective daughter board, when this is in its receiving station, so as to retain the respective daughter board in position engaged with the mother board, the second restraint bar extending laterally of the first restraint bar and towards the rear of the mother board carrier.

23. An electronic unit according to claim 22 wherein the second restraint bar is pivoted at a rear end for vertical pivotal movement into and out of its holding position and the first restraint bar is pivotally movable about an axis extending along a front region of the mother board carrier into and out of its holding position, and in its holding position, the first restraint bar holds the second restraint bar in its holding position.

24. An electronic unit comprising a support structure having a front and a rear and carrying a mother board carrier and a service carrier with both carriers being movable independently of one another between retracted use positions within the support structure and access positions forward of the support structure;

the mother board carrier having a mother board mounting position and daughter board receiving stations extending from the mother board mounting position and the mother board carrier also comprising a first plurality of air directed electrical conductors extending from electrical terminals in the mother board carrier to a first electrical connector means in the mother board carrier, the first plurality of electrical conductors movable with the mother board carrier between its retracted use and access positions;

the service carrier having a third connector means and comprising a second plurality of air directed electrical conductors extending from the third connector means to electrical terminals in the service carrier, the second plurality of electrical conductors movable with the service carrier between its retracted use and access positions;

the support structure having a second connector means and a fourth connector means electrically connected to the second connector means; and the first connector means being electrically connected to the second connector means only when the mother board carrier is in its retracted use position and the fourth connector means being electrically connected to the third connector means only when the service carrier is in its retracted use position.

25. An electronic unit comprising a mother board carrier defining a mother board mounting position;

a plurality of side-by-side daughter board receiving stations;

a mother board for mounting in the mounting position;

a plurality of daughter boards for location in the receiving stations and for connection to the mother board, each daughter board having a face plate and each face plate and the carrier having cooperable registration means to detachably dispose the respective daughter board in a fixed position in its receiving station;

and a retaining bar provided to retain the daughter boards in their fixed positions.

26. An electronic unit according to claim 25 wherein each face plate has a flange and the carrier has an abutment surface for abutting reception of the flange of each face plate when the respective daughter board is in its receiving station, and the registration means is provided partly upon the abutment surface and partly by the flange.

27. An electronic unit according to claim 26 wherein the registration means comprises a raised portion of the abutment surface and opposing edges of the flange which engage edges of the raised portion for registration purposes and with the raised portion extending into an opening in the flange and defined between the opposing edges of the flange.

* * * * *